(12) United States Patent  
Sakamoto et al.

(10) Patent No.: US 7,939,430 B2
(45) Date of Patent: May 10, 2011

(54) LASER PROCESSING METHOD

(75) Inventors: Takeshi Sakamoto, Hamamatsu (JP);
Ryuji Sugiura, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 549 days.

(21) Appl. No.: 11/667,538

(22) PCT Filed: Nov. 10, 2005

(86) PCT No.: PCT/JP2005/020618
§ 371 (c)(1),
(2), (4) Date: May 12, 2008

(87) PCT Pub. No.: WO2006/051861
PCT Pub. Date: May 18, 2006

(65) Prior Publication Data
US 2009/0081851 A1 Mar. 26, 2009

(30) Foreign Application Priority Data
Nov. 12, 2004 (JP) ................ P2004-329532

(51) Int. Cl.
*H01L 31/00* (2006.01)
(52) U.S. Cl. .. 438/464; 438/797; 438/795; 257/E21.596
(58) Field of Classification Search ........ 257/98, 257/E21.596; 438/797, 795.7, 463, 458, 438/584, 106, 113, 462, 667, 464, 795; 219/121.67, 219/121.72; 700/121
See application file for complete search history.

(56) References Cited

U.S. PATENT DOCUMENTS
6,992,026 B2    1/2006   Fukuyo et al.
2004/0002199 A1  1/2004   Fukuyo et al.
(Continued)

FOREIGN PATENT DOCUMENTS
EP    1 494 271    1/2005
(Continued)

OTHER PUBLICATIONS
siliconfareast.com:http://www.siliconfareast.com/sio2si3n4.htm.*
(Continued)

*Primary Examiner* — Evan Pert
*Assistant Examiner* — Matthew Reames
(74) *Attorney, Agent, or Firm* — Drinker Biddle & Reath LLP

(57) ABSTRACT

A laser processing method is provided, which, when cutting an object to be processed comprising a substrate and a multilayer part, formed on a front face of the substrate, including a functional device, can cut the multilayer part with a high precision in particular.

In a state where a protective tape 22 is attached to the front face 16a of a multilayer part 16, a substrate 4 is irradiated with laser light L while using its rear face 4b as a laser light entrance surface, so as to form a modified region 7 within the substrate 4 along a line to cut, thereby generating a fracture 24 reaching the front face 4a of the substrate 4 from a front-side end part 7a of the modified region 7. Attaching an expandable tape to the rear face 4b of the substrate 4 and expanding it in the state where such a fracture 24 is generated can cut not only the substrate 4 but also the multilayer part 16 on the line to cut, i.e., interlayer insulating films 17a, 17b, with a favorable precision along the line to cut.

7 Claims, 32 Drawing Sheets

U.S. PATENT DOCUMENTS

| | | |
|---|---|---|
| 2005/0202596 A1 | 9/2005 | Fukuyo et al. |
| 2006/0011593 A1 | 1/2006 | Fukuyo et al. |
| 2007/0085099 A1 | 4/2007 | Fukumitsu et al. |

FOREIGN PATENT DOCUMENTS

| | | |
|---|---|---|
| EP | 1 498 216 | 1/2005 |
| EP | 1 610 364 | 12/2005 |
| JP | 2002-192367 | 7/2002 |
| JP | 2003-154517 | 5/2003 |
| JP | 2003-334812 | 11/2003 |
| JP | 2003-338467 | 11/2003 |
| JP | 2004-1076 | 1/2004 |
| JP | 2004-22936 | 1/2004 |
| JP | 2005-57257 | 3/2005 |
| WO | WO 03/076119 | 9/2003 |
| WO | WO 03/076120 | 9/2003 |
| WO | WO 03/077295 | 9/2003 |

OTHER PUBLICATIONS

K. Hayashi; "Inner Glass Marking by Harmonics of Solid-State Laser", Proceedings of $45^{th}$ Laser Materials Processing Conference, Dec. 1998, pp. 23-28.

K. Miura et al., "Formation of Photo-Induced Structures in Glasses with Femtosecond Laser", Proceedings of $42^{nd}$ Laser Materials Processing Conference, Nov. 1997, pp. 105-111.

T. Sano et al., "Evaluation of Processing Characteristics of Silicon with Picosecond Pulse Laser", Preprints of the National Meeting of Japan Welding Society, No. 66, Apr. 2000, pp. 72-73 (with at least partial English translation).

* cited by examiner

*Fig.16*
(a)
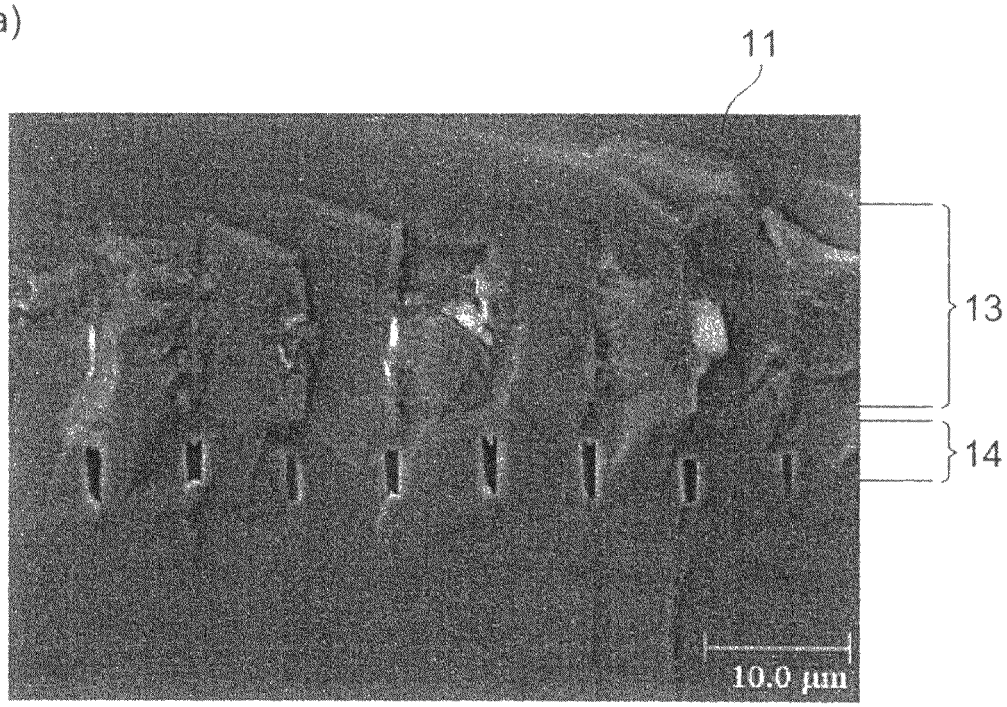
(b)
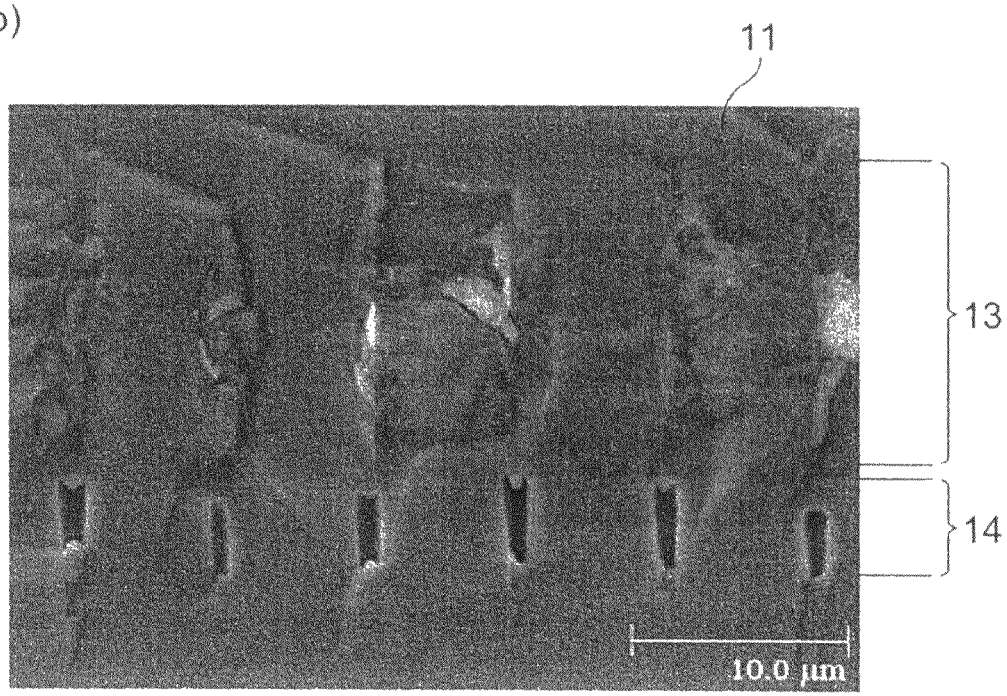

Fig.19
(a)
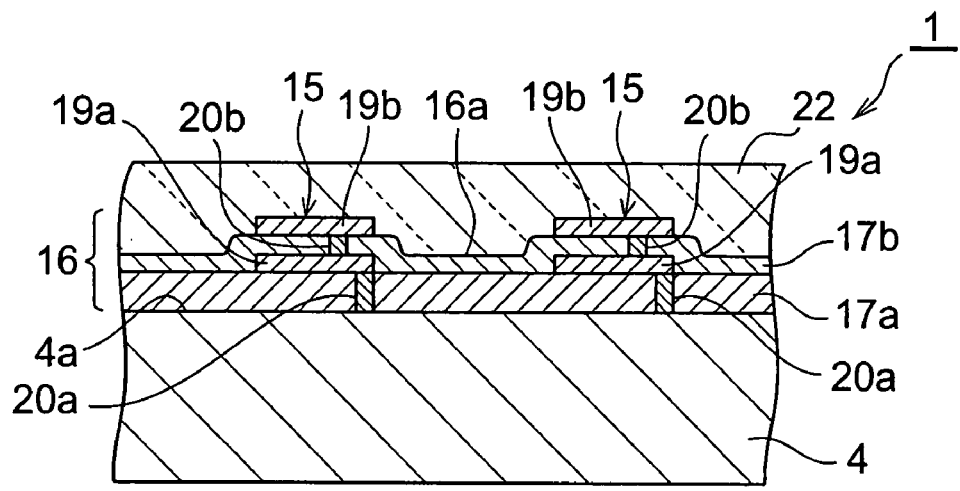
(b)
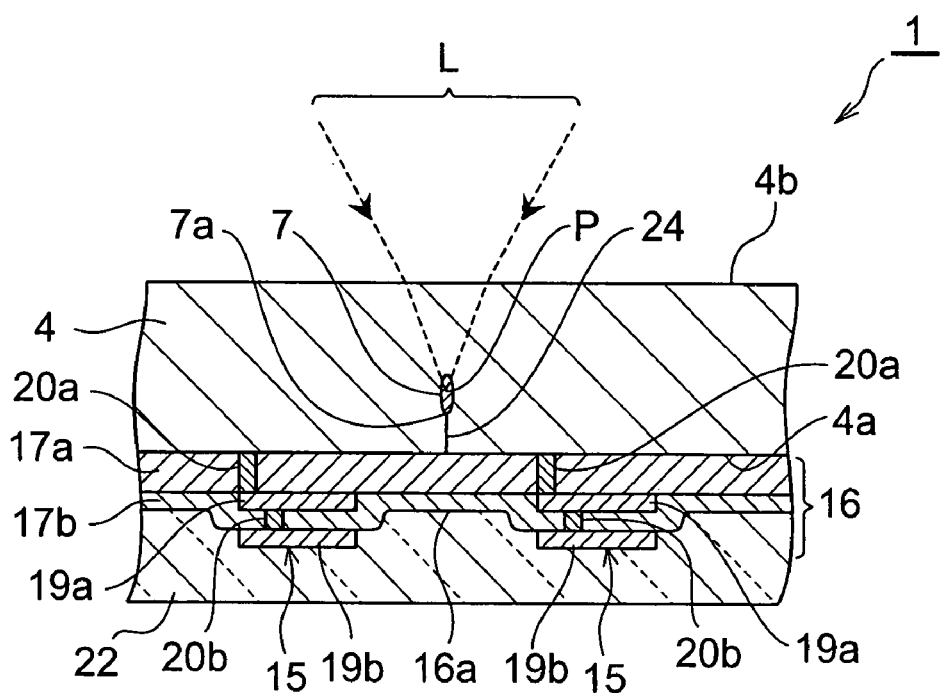

Fig.20
(a)
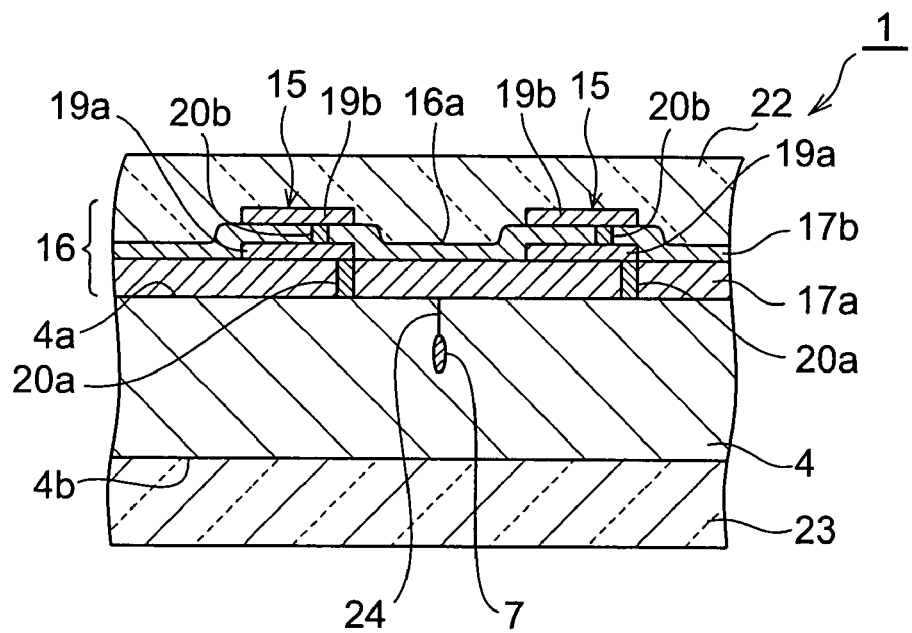
(b)
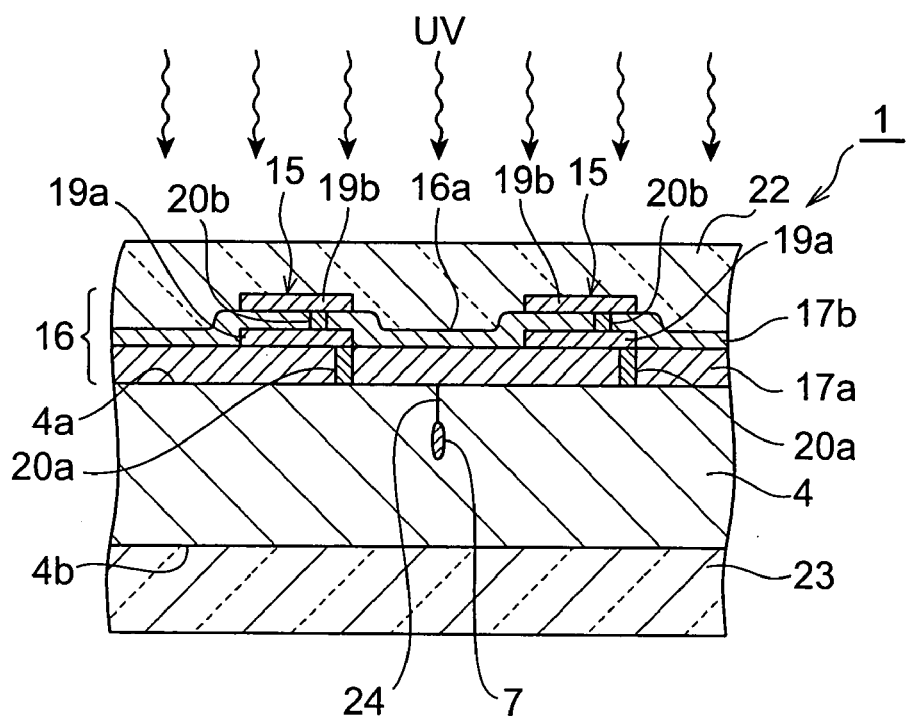

Fig.21
(a)
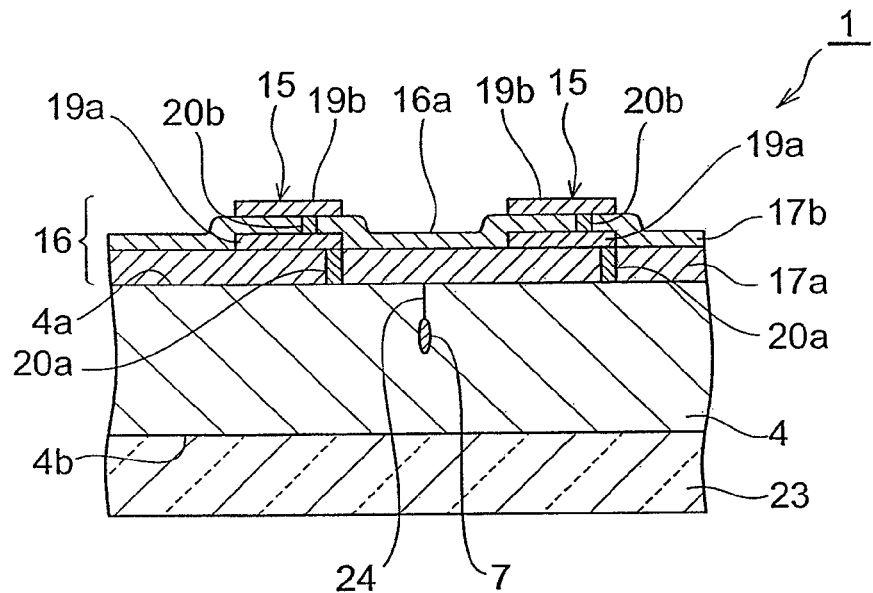
(b)
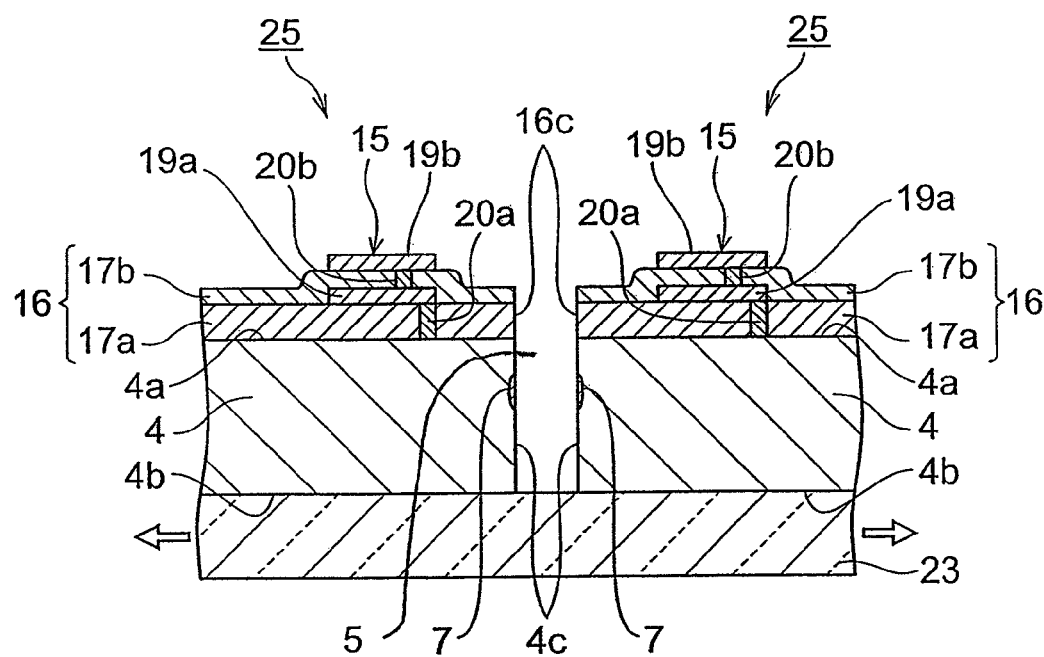

Fig.24
(a)
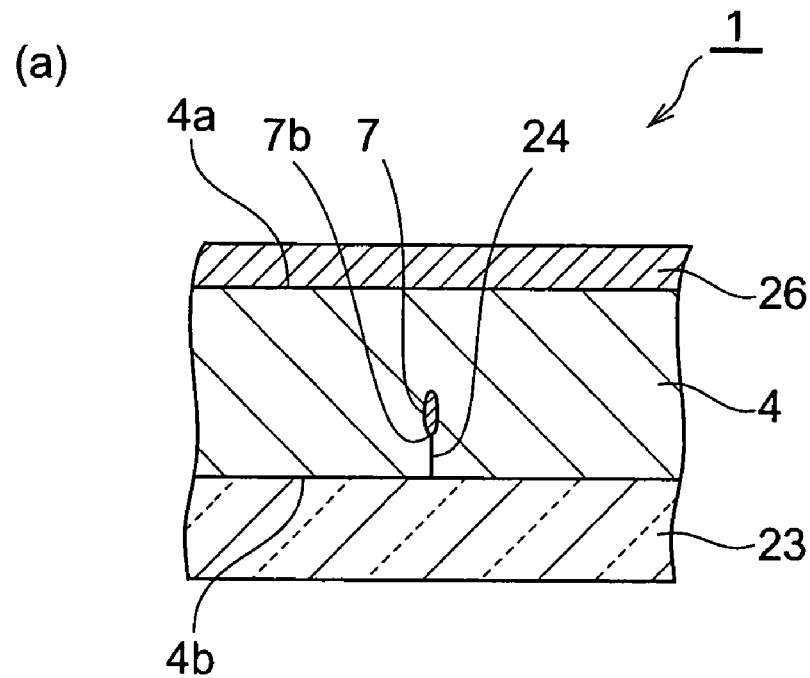
(b)
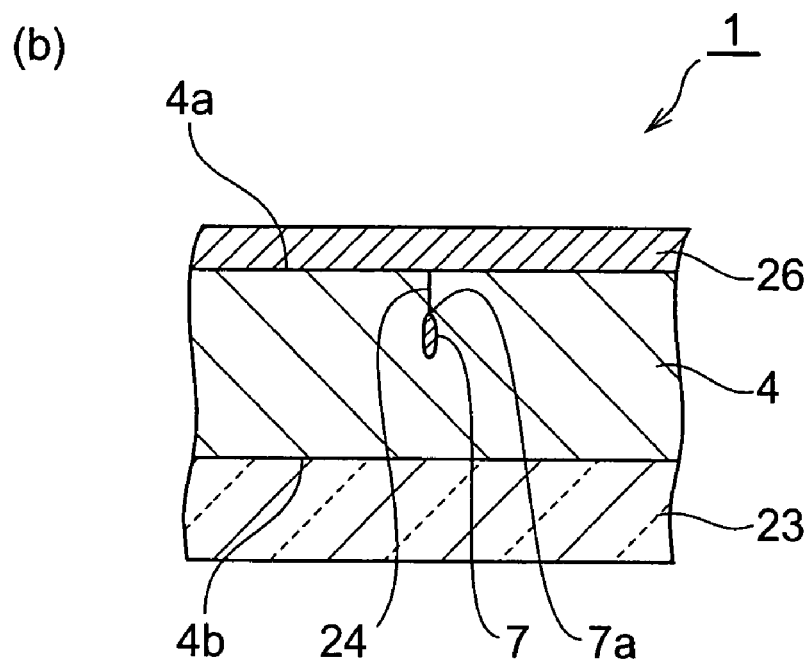

Fig.25
(a)
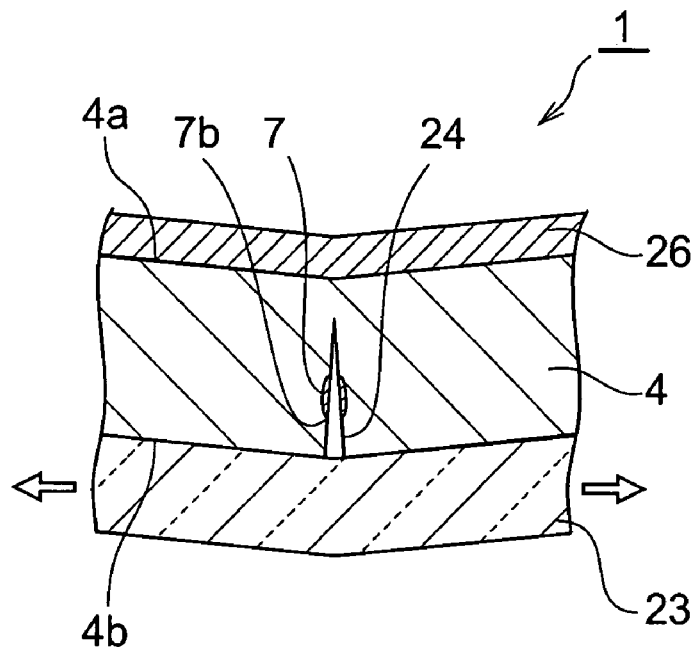
(b)
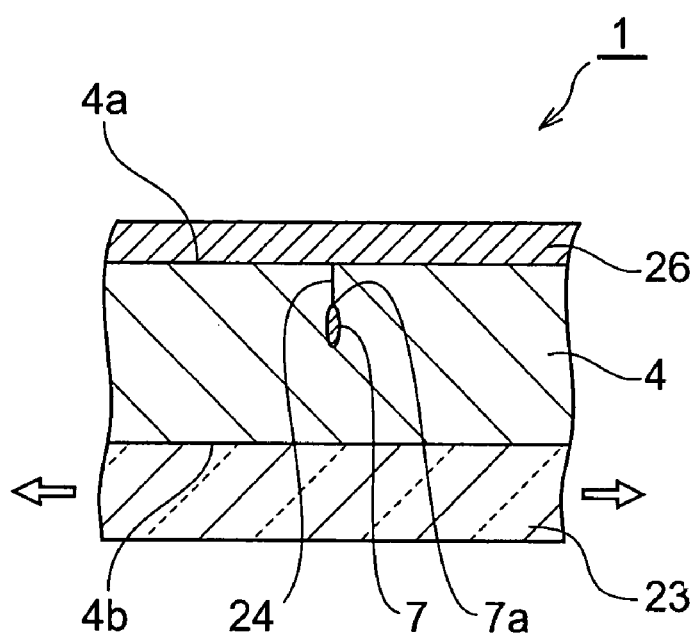

*Fig.32*
(a)
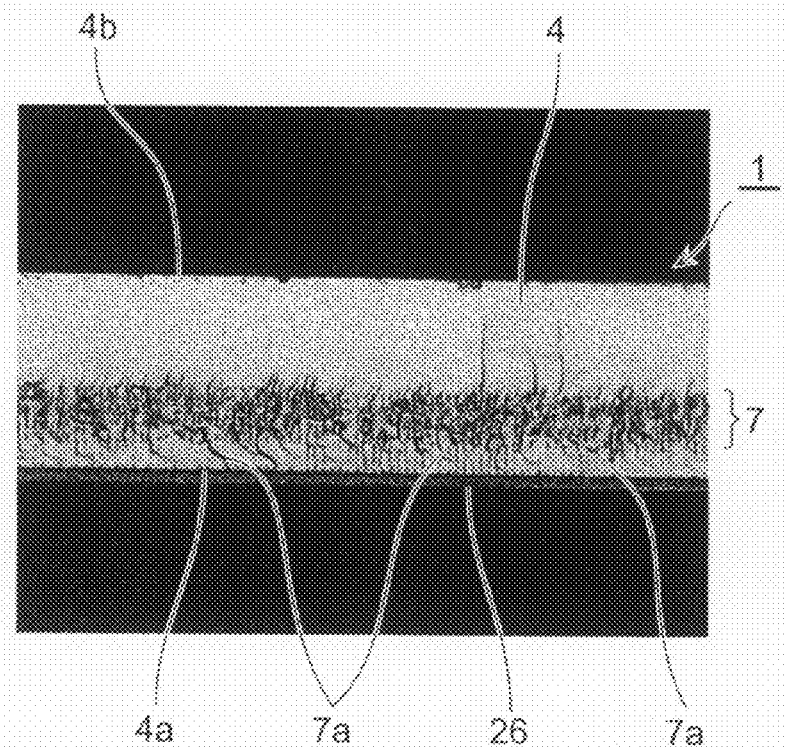
(b)
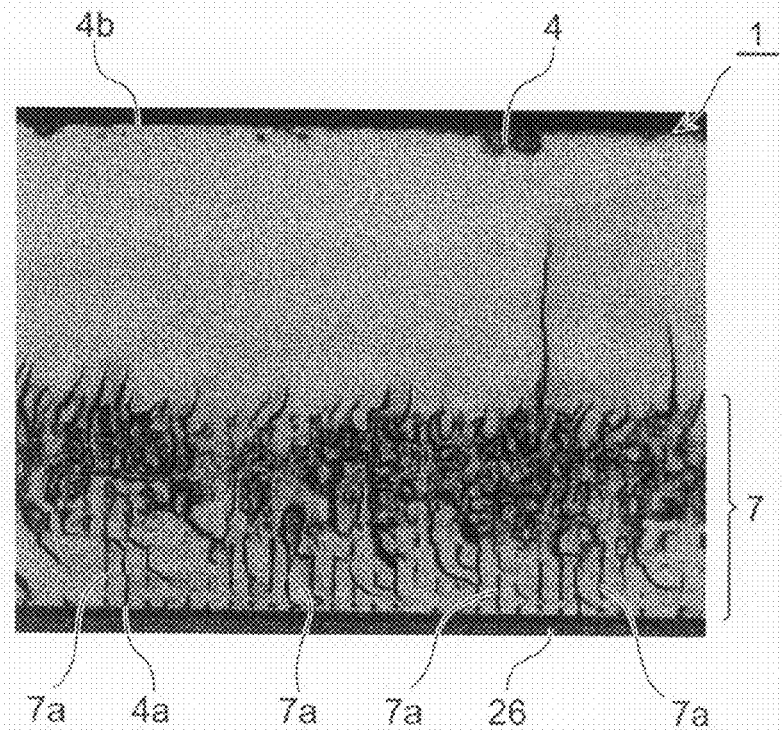

LASER PROCESSING METHOD

TECHNICAL FIELD

The present invention relates to a laser processing method of cutting an object to cut, which comprises a substrate and a multilayer part, formed on a front face of the substrate, including a functional device, along a line to cut.

BACKGROUND ART

Conventionally known as this kind of technique is a laser processing method which irradiates a substrate formed with a multilayer part including a plurality of functional devices while locating a converging point therewithin, so as to form a modified region within the substrate along a line to cut, and cuts the substrate and multilayer part from the modified region acting as a start point (see, for example, Patent Document 1).

Patent Document 1: Japanese Patent Application Laid-Open No. 2003-334812

DISCLOSURE OF THE INVENTION

Problem to be Solved by the Invention

The laser processing method such as the one mentioned above is an effective technique in that it can cut the substrate and multilayer part with a high precision. In connection with such a technique, there has been a demand for a technique which, when forming a modified region within a substrate formed with a multilayer part including a plurality of functional devices along a line to cut, makes it possible to cut the multilayer part with a higher precision in particular from the modified region acting as a start point.

In view of such circumstances, it is an object of the present invention to provide a laser processing method which, when cutting an object to be processed comprising a substrate and a multilayer part, formed on a front face of the substrate, including a functional device, can cut the multilayer part with a high precision in particular.

Means for Solving Problem

For achieving the above-mentioned object, the laser processing method in accordance with the present invention is a laser processing method of cutting an object to be processed comprising a substrate and a multilayer part, formed on a front face of the substrate, including a functional device along a line to cut, the method comprising the steps of attaching a protective member to a front face of the multilayer part; irradiating the substrate with laser light while using a rear face of the substrate as a laser light entrance surface and locating a converging point within the substrate, so as to form a modified region to become a starting point region for cutting within the substrate along the line to cut in the substrate, thereby generating a fracture reaching at least the front face of the substrate from a front-side end part of the modified region; attaching an expandable member to the rear face of the substrate after generating the fracture; and cutting the object along the line to cut by expanding the expandable member after attaching the expandable member.

In the state where a protective member is attached to the front face of the multilayer part, this laser processing method irradiates the substrate with laser light while using the rear face of the substrate as a laser light entrance surface, so as to form a modified region within the substrate along the line to cut, thereby generating a fracture reaching at least the front face of the substrate from a front-side end part of the modified region. Then, attaching an expandable member to the rear face of the substrate and expanding it while in the state generating such a fracture can cut not only the substrate but also the multilayer part along the line to cut with a favorable precision in particular. Therefore, when cutting an object to be processed comprising a substrate and a multilayer part, formed on a front face of the substrate, including a functional device, this laser processing method can cut the multilayer part with a high precision in particular.

The functional device refers to semiconductor operating layers formed by crystal growth, light-receiving devices such as photodiodes, light-emitting devices such as laser diodes, and circuit devices formed as circuits, for example. The modified region is formed by irradiating the substrate with laser light while locating a converging point therewithin, so as to form multiphoton absorption or light absorption equivalent thereto within the substrate.

The above-mentioned laser processing method may generate either a fracture reaching the inside of the multilayer part from the front-side end part of the modified region or a fracture reaching the front face of the multilayer part from the front-side end part of the modified region.

Preferably, the modified region is formed such that a center of the modified region is positioned closer to the front face of the substrate than is a center of the substrate. Thus forming the modified region can make it easier to generate the fracture reaching at least the front face of the substrate from the front-side end part of the modified region.

Here is a case where the substrate is a semiconductor substrate, while the modified region includes a molten processed region. Since this molten processed region is an example of the above-mentioned modified region, the multilayer part can be cut with a high precision in particular when cutting the object to be processed comprising the substrate and the multilayer part, formed on the front face of the substrate, including the functional device in this case as well.

There is also a case where the substrate is a semiconductor substrate, while the modified region includes a molten processed region and a microcavity positioned closer to the front face of the substrate than is the molten processed region. Since each of the molten processed region and microcavity is an example of the above-mentioned modified region, the multilayer part can be cut with a high precision in particular when cutting the object to be processed comprising the substrate and the multilayer part, formed on the front face of the substrate, including the functional device in this case as well.

The laser processing method in accordance with the present invention is particularly effective in the case where the multilayer part includes a low dielectric constant film. Though the low dielectric constant film has a low mechanical strength and a property of being hard to blend with other materials in general and thus is likely to tear and peel off, the laser processing method in accordance with the present invention can prevent low dielectric constant film from tearing and peeling off and cut it with a high precision together with the substrate.

Effect of the Invention

When cutting an object to be processed comprising a substrate and a multilayer part, formed on a front face of the substrate, including a functional device, the present invention can cut the multilayer part with a high precision in particular.

BRIEF DESCRIPTION OF THE DRAWINGS

FIG. 16 A view showing photographs of a cut section of a silicon wafer formed with molten processed regions and microcavities by the laser processing method in accordance with the embodiment.

FIG. 19 A sectional view of a part of the object for explaining the laser processing method in accordance with the embodiment, in which (a) is a state where a protective tape is attached to the object, and (b) is a state where the object is irradiated with laser light.

FIG. 20 A sectional view of a part of the object for explaining the laser processing method in accordance with the embodiment, in which (a) is a state where an expandable tape is attached to the object, and (b) is a state where the protective tape is irradiated with UV rays.

FIG. 21 A sectional view of a part of the object for explaining the laser processing method in accordance with the embodiment, in which (a) is a state where the protective tape is peeled off from the object, and (b) is a state where the expandable tape is expanded.

FIG. 24 A sectional view of a part of the object for explaining a first reason why a low dielectric constant film can be cut with a high precision when a fracture reaching the front face of the substrate from the front-side end part of the modified region is generated.

FIG. 25 A sectional view of a part of the object for explaining a second reason why a low dielectric constant film can be cut with a high precision when a fracture reaching the front face of the substrate from the front-side end part of the modified region is generated.

FIG. 32 A view showing photographs of a cut section of a substrate in which a modified region is formed such that the front-side end part of the modified region extends like a streak to the front face of the substrate.

EXPLANATIONS OF NUMERALS AND LETTERS

1 . . . object to be processed; 4 . . . substrate; 4a . . . front face of the substrate; 4b . . . rear face of the substrate; 4c . . . side face of the substrate; 5 . . . line to cut; 7 . . . modified region; 7a . . . front-side end part of the modified region; 13 . . . molten processed region; 14 . . . microcavity; 15 . . . functional device; 16 . . . multilayer part; 16a . . . front face of the multilayer part; 22 . . . protective tape (protective member); 23 . . . expandable tape (expandable member); 24 . . . fracture; 25 . . . semiconductor chip; 26 . . . low dielectric constant film; L . . . laser light; P . . . converging point

BEST MODES FOR CARRYING OUT THE INVENTION

In the following, a preferred embodiment of the present invention will be explained in detail with reference to the drawings. In the laser processing method in accordance with the embodiment, a phenomenon known as multiphoton absorption is used for forming a modified region within an object to be processed. Therefore, to begin with, a laser processing method for forming a modified region by the multiphoton absorption will be explained.

A material becomes transparent when its absorption bandgap $E_G$ is greater than photon energy hv. Consequently, a condition under which absorption occurs in the material is hv>$E_G$. However, even when optically transparent, the material generates absorption under a condition of nhv>$E_G$ (where n=2, 3, 4, . . . ) if the intensity of laser light becomes very high. This phenomenon is known as multiphoton absorption. In the case of pulsed waves, the intensity of laser light is determined by the peak power density (W/cm$^2$) of laser light at its converging point. The multiphoton absorption occurs under a condition where the peak power density is 1×10$^8$ (W/cm$^2$) or greater, for example. The peak power density is determined by (energy of laser light at the converging point per pulse)/(beam spot cross-sectional area of laser light×pulse width). In the case of continuous waves, the intensity of laser light is determined by the field intensity (W/cm$^2$) of laser light at the converging point.

Figure 1:
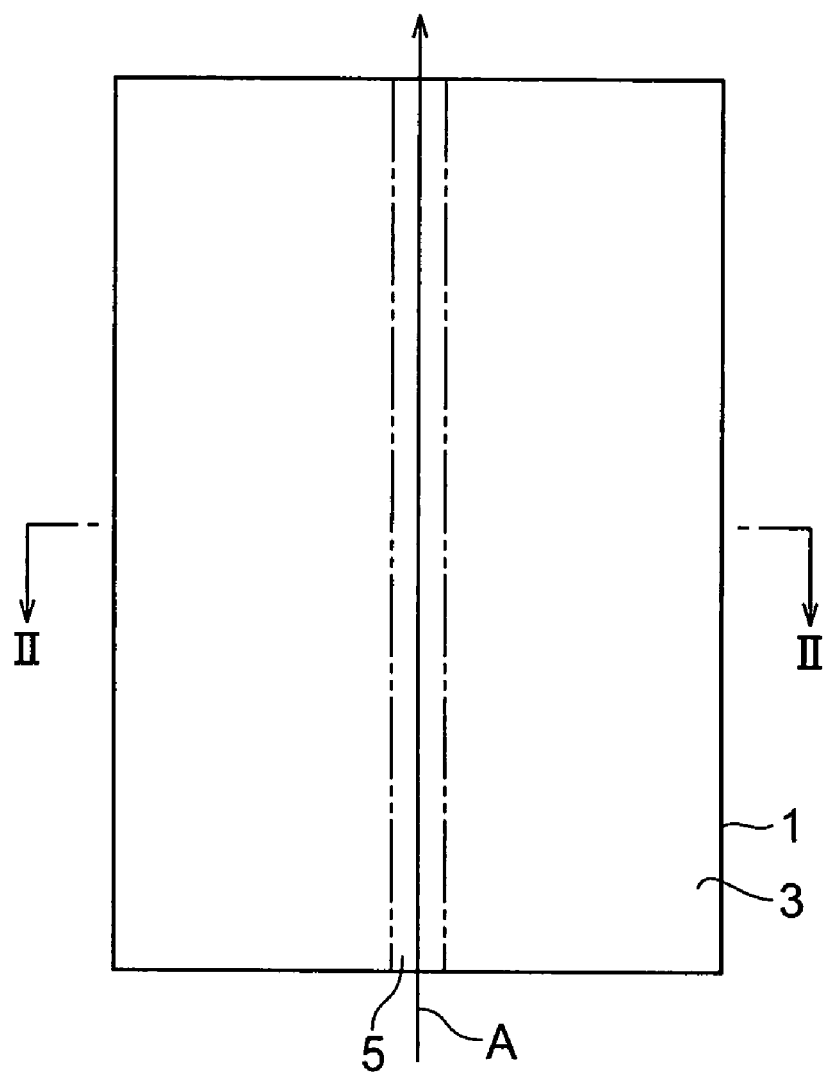
FIG. 1 A plan view of an object to be processed during laser processing by a laser processing method in accordance with an embodiment.
Figure 2:
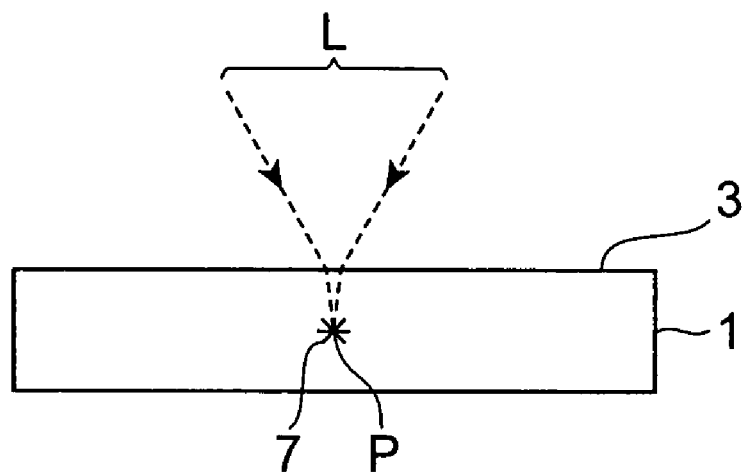
FIG. 2 A sectional view of the object taken along the line II-II of FIG. 1.

The principle of the laser processing method in accordance with the embodiment using such multiphoton absorption will be explained with reference to FIGS. 1 to 6. As shown in FIG. 1, on a front face 3 of a planar object to be processed 1, a line to cut 5 for cutting the object 1 exists. The line to cut 5 is a virtual line extending straight. As shown in FIG. 2, the laser processing method in accordance with this embodiment irradiates the object 1 with laser light L while locating a converging point P therewithin under a condition generating multiphoton absorption, so as to form a modified region 7. The converging point P is a position at which the laser light L is converged. The line to cut 5 may be curved instead of being straight, and may be a line actually drawn on the object 1 without being restricted to the virtual line.

Figure 3:
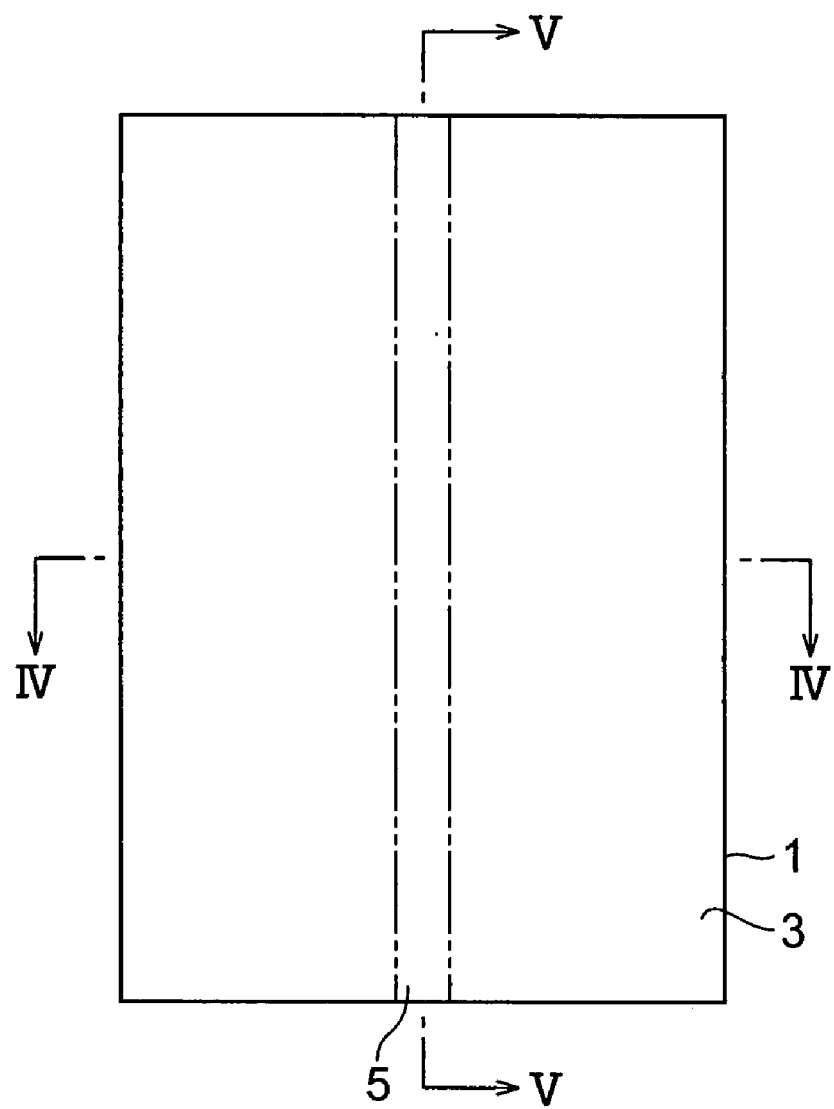
FIG. 3 A plan view of the object after the laser processing by the laser processing method in accordance with the embodiment.
Figure 4:
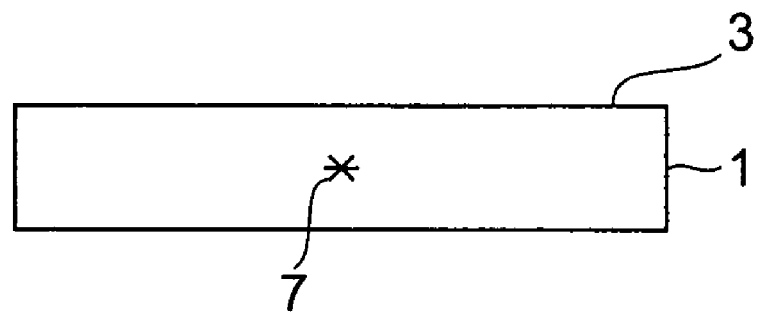
FIG. 4 A sectional view of the object taken along the line IV-IV of FIG. 3.
Figure 5:
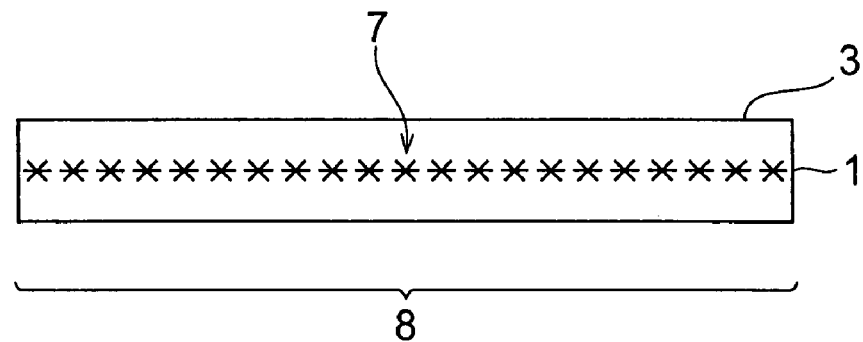
FIG. 5 A sectional view of the object taken along the line V-V of FIG. 3.

Then, the laser light L is relatively moved along the line to cut 5 (i.e., in the direction of arrow A in FIG. 1), so as to shift the converging point P along the line to cut 5. Consequently, as shown in FIGS. 3 to 5, the modified region 7 is formed along the line to cut 5 within the object 1, and becomes a starting point region for cutting 8. The starting point region for cutting 8 refers to a region which becomes a start point for cutting (fracturing) when the object 1 is cut. The starting point region for cutting 8 may be made by forming the modified region 7 either continuously or intermittently.

In the laser processing method in accordance with this embodiment, the modified region 7 is not formed by the heat generated from the object 1 absorbing the laser light L. The laser light L is transmitted through the object 1, so as to generate multiphoton absorption therewithin, thereby forming the modified region 7. Therefore, the front face 3 of the object 1 hardly absorbs the laser light L and does not melt.

Figure 6:
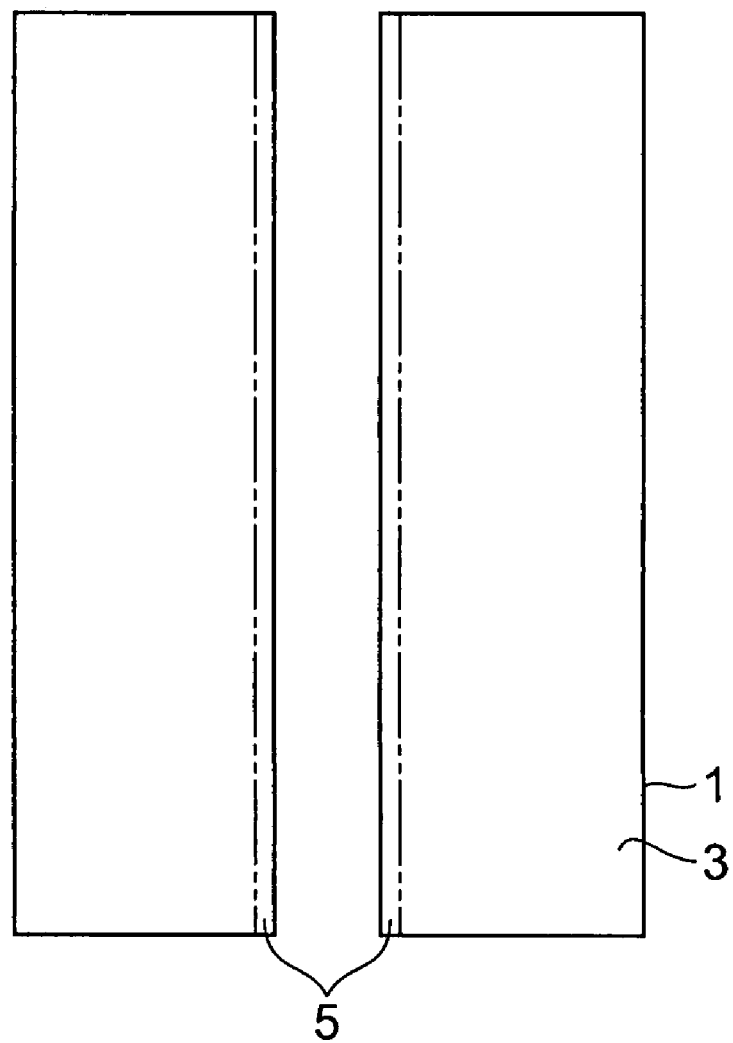
FIG. 6 A plan view of the object cut by the laser processing method in accordance with the embodiment.

Forming the starting point region for cutting 8 within the object 1 makes it easier to generate fractures from the starting point region for cutting 8 acting as a start point, whereby the object 1 can be cut with a relatively small force as shown in FIG. 6. Therefore, the object 1 can be cut with a high precision without generating unnecessary fractures on the front face 3 of the object 1.

There seem to be the following two ways of cutting the object 1 from the starting point region for cutting 8 acting as a start point. One is where an artificial force is applied to the object 1 after the starting point region for cutting 8 is formed, so that the object 1 fractures from the starting point region for cutting 8 acting as a start point, whereby the object 1 is cut. This is the cutting in the case where the object 1 has a large thickness, for example. Applying an artificial force refers to exerting a bending stress or shear stress to the object 1 along the starting point region for cutting 8, or generating a thermal stress by applying a temperature difference to the object 1, for example. The other is where the forming of the starting point region for cutting 8 causes the object 1 to fracture naturally in its cross-sectional direction (thickness direction) from the starting point region for cutting 8 acting as a start point, thereby cutting the object 1. This becomes possible if the starting point region for cutting 8 is formed by one row of the modified region 7 when the object 1 has a small thickness, or if the starting point region for cutting 8 is formed by a plurality of rows of the modified region 7 in the thickness direction when the object 1 has a large thickness. Even in this naturally fracturing case, fractures do not extend onto the front face 3 at a portion corresponding to an area not formed with the starting point region for cutting 8 in the part to cut, so that only the portion corresponding to the area formed with the starting point region for cutting 8 can be cleaved, whereby cleavage can be controlled well. Such a cleaving method with a favorable controllability is very effective, since the object 1 to be processed such as silicon wafer has recently been apt to decrease its thickness.

The modified region formed by multiphoton absorption in the laser processing method in accordance with this embodiment encompasses the following cases (1) to (4):

(1) Case Where the Modified Region is a Crack Region Including One Crack or a Plurality of Cracks An object to be processed (e.g., glass or a piezoelectric material made of LiTaO$_3$) is irradiated with laser light while locating a converging point therewithin under a condition with a field intensity of at least 1×10$^8$ (W/cm$^2$) at the converging point and a pulse width of 1 µs or less. This magnitude of pulse width is a condition under which a crack region can be formed only within the object while generating multiphoton absorption without causing unnecessary damages on the front face of the object. This generates a phenomenon of optical damage by multiphoton absorption within the object. This optical damage induces a thermal distortion within the object, thereby forming a crack region therewithin. The upper limit of field intensity is 1×10$^{12}$ (W/cm$^2$), for example. The pulse width is preferably 1 ns to 200 ns, for example. The forming of a crack region by multiphoton absorption is disclosed, for example, in "Internal Marking of Glass Substrate with Solid-state Laser", Proceedings of the 45th Laser Materials Processing Conference (December, 1998), pp. 23-28.

The inventors determined the relationship between field intensity and crack size by an experiment. The following are conditions of the experiment.

(A) Object to be processed: Pyrex (registered trademark) glass (with a thickness of 700 µm)
(B) Laser
light source: semiconductor laser pumping Nd:YAG laser
wavelength: 1064 nm
laser light spot cross-sectional area: 3.14×10$^{-8}$ cm$^2$
oscillation mode: Q-switched pulse
repetition frequency: 100 kHz
pulse width: 30 ns
output: output<1 mJ/pulse
laser light quality: TEM$_{00}$
polarizing property: linear polarization
(C) Condenser lens
transmittance at a laser light wavelength: 60%
(D) Moving rate of the mount table mounting the object: 100 mm/sec The laser light quality of TEM$_{00}$ means that the converging characteristic is so high that convergence to about the wavelength of laser light is possible.

Figure 7:
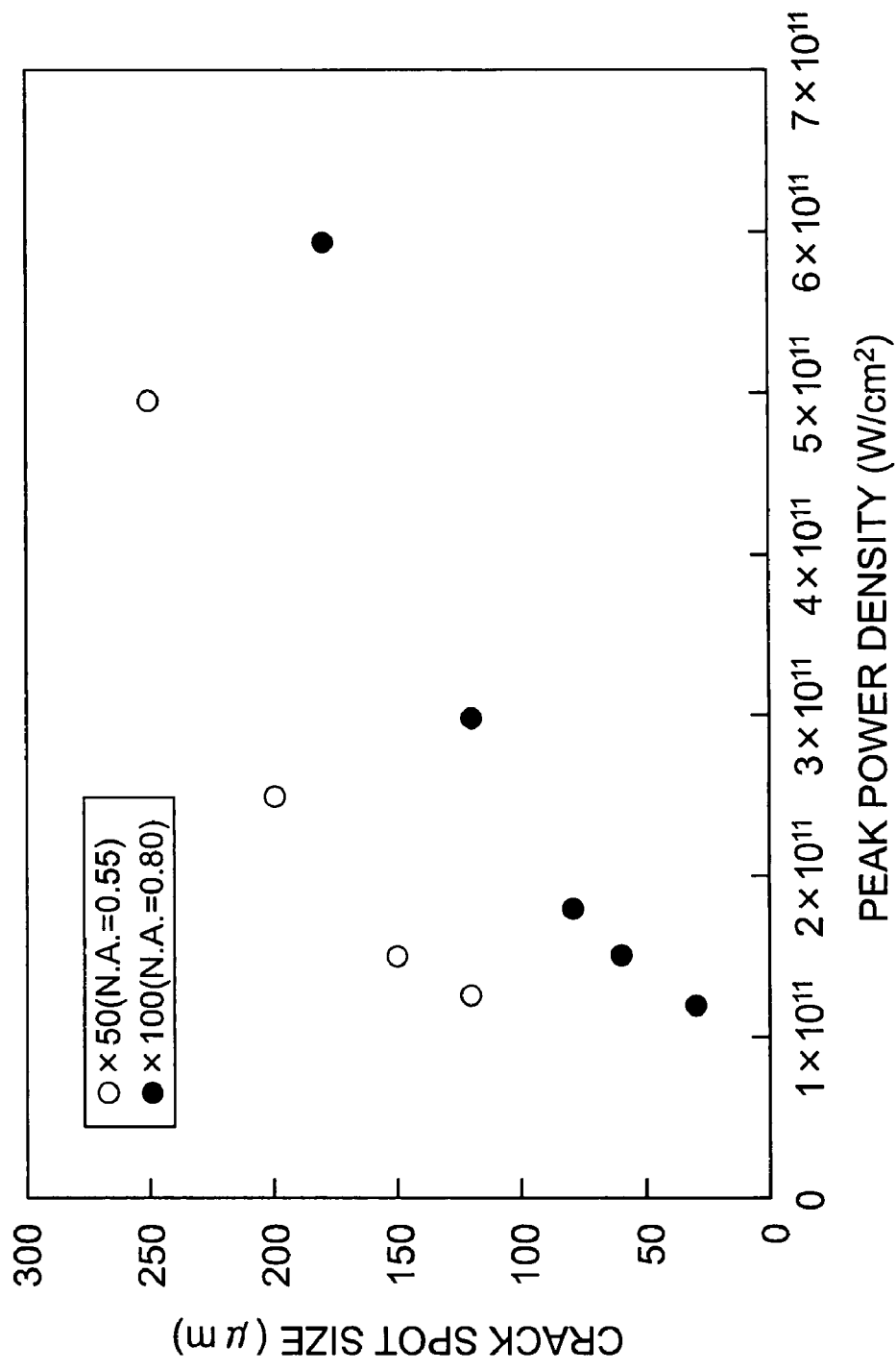
FIG. 7 A graph showing relationships between the field intensity and crack spot size in the laser processing method in accordance with the embodiment.

FIG. 7 is a graph showing the results of the above-mentioned experiment. The abscissa indicates the peak power density. Since the laser light is pulsed laser light, the field intensity is represented by the peak power density. The ordinate indicates the size of a crack part (crack spot) formed within the object by one pulse of laser light. Crack spots gather to yield a crack region. The crack spot size is the size of a part yielding the maximum length among forms of crack spots. Data represented by black circles in the graph refer to a case where the condenser lens (C) has a magnification of ×100 and a numerical aperture (NA) of 0.80. On the other hand, data represented by whitened circles in the graph refer to a case where the condenser lens (C) has a magnification of ×50 and a numerical aperture (NA) of 0.55. Crack spots are seen to occur within the object from when the peak power density is about $10^{11}$ (W/cm$^2$) and become greater as the peak power density increases.

Figure 8:
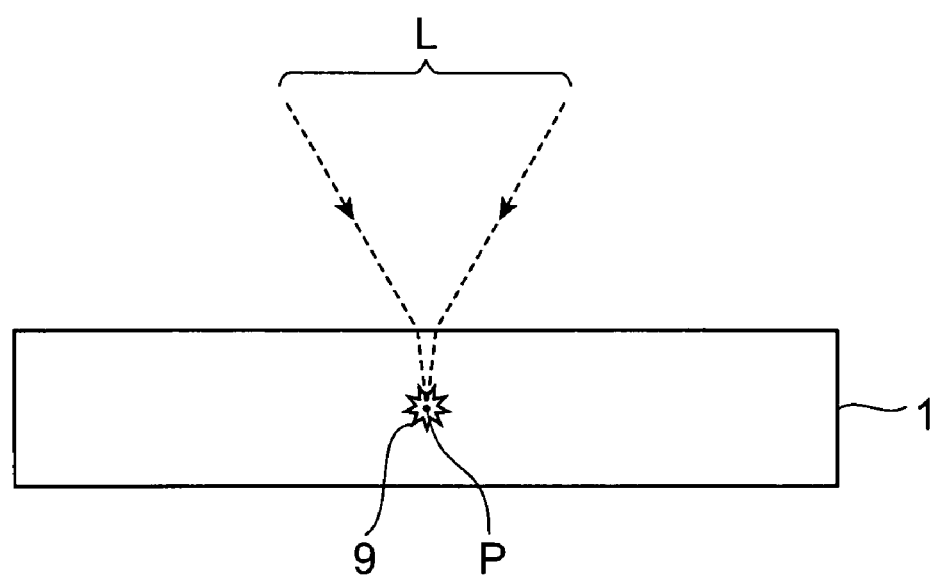
FIG. 8 A sectional view of the object in a first step of the laser processing method in accordance with the embodiment.
Figure 9:
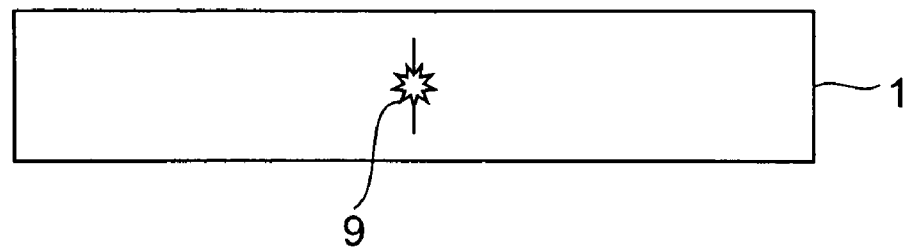
FIG. 9 A sectional view of the object in a second step of the laser processing method in accordance with the embodiment.
Figure 10:
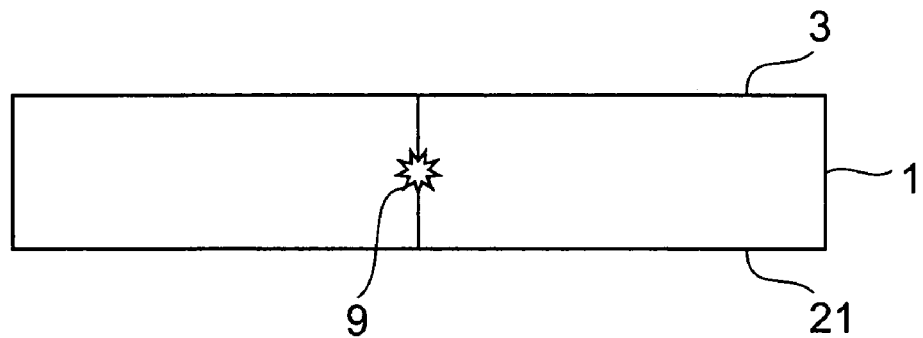
FIG. 10 A sectional view of the object in a third step of the laser processing method in accordance with the embodiment.
Figure 11:
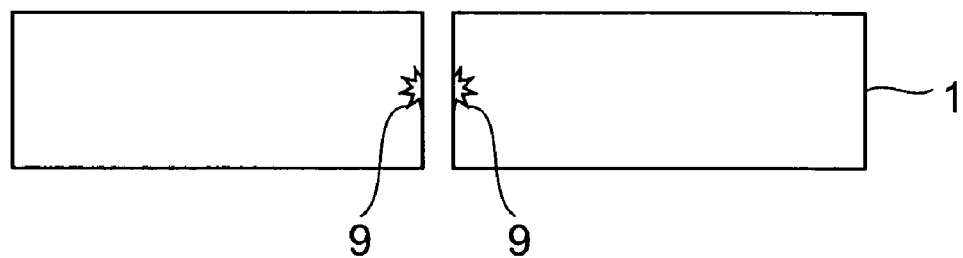
FIG. 11 A sectional view of the object in a fourth step of the laser processing method in accordance with the embodiment.

A mechanism by which the object to be processed is cut by forming a crack region will now be explained with reference to FIGS. 8 to 11. As shown in FIG. 8, the object 1 is irradiated with laser light L while the converging point P is located within the object 1 under a condition where multiphoton absorption occurs, so as to form a crack region 9 therewithin along a line to cut. The crack region 9 is a region containing one crack or a plurality of cracks. Thus formed crack region 9 becomes a starting point region for cutting. A crack further grows from the crack region 9 acting as a start point (i.e., from the starting point region for cutting acting as a start point) as shown in FIG. 9, and reaches the front face 3 and rear face 21 of the object 1 as shown in FIG. 10, whereby the object 1 fractures and is consequently cut as shown in FIG. 11. The crack reaching the front face 3 and rear face 21 of the object 1 may grow naturally or as a force is applied to the object 1.

(2) Case Where the Modified Region is a Molten Processed Region

An object to be processed (e.g., semiconductor material such as silicon) is irradiated with laser light while locating a converging point within the object under a condition with a field intensity of at least $1\times10^8$ (W/cm$^2$) at the converging point and a pulse width of 1 µs or less. As a consequence, the inside of the object is locally heated by multiphoton absorption. This heating forms a molten processed region within the object. The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example. The upper limit of field intensity is $1\times10^{12}$ (W/cm$^2$), for example. The pulse width is preferably 1 ns to 200 ns, for example.

By an experiment, the inventors verified that a molten processed region was formed within a silicon wafer. The following are conditions of the experiment.

Figure 12:
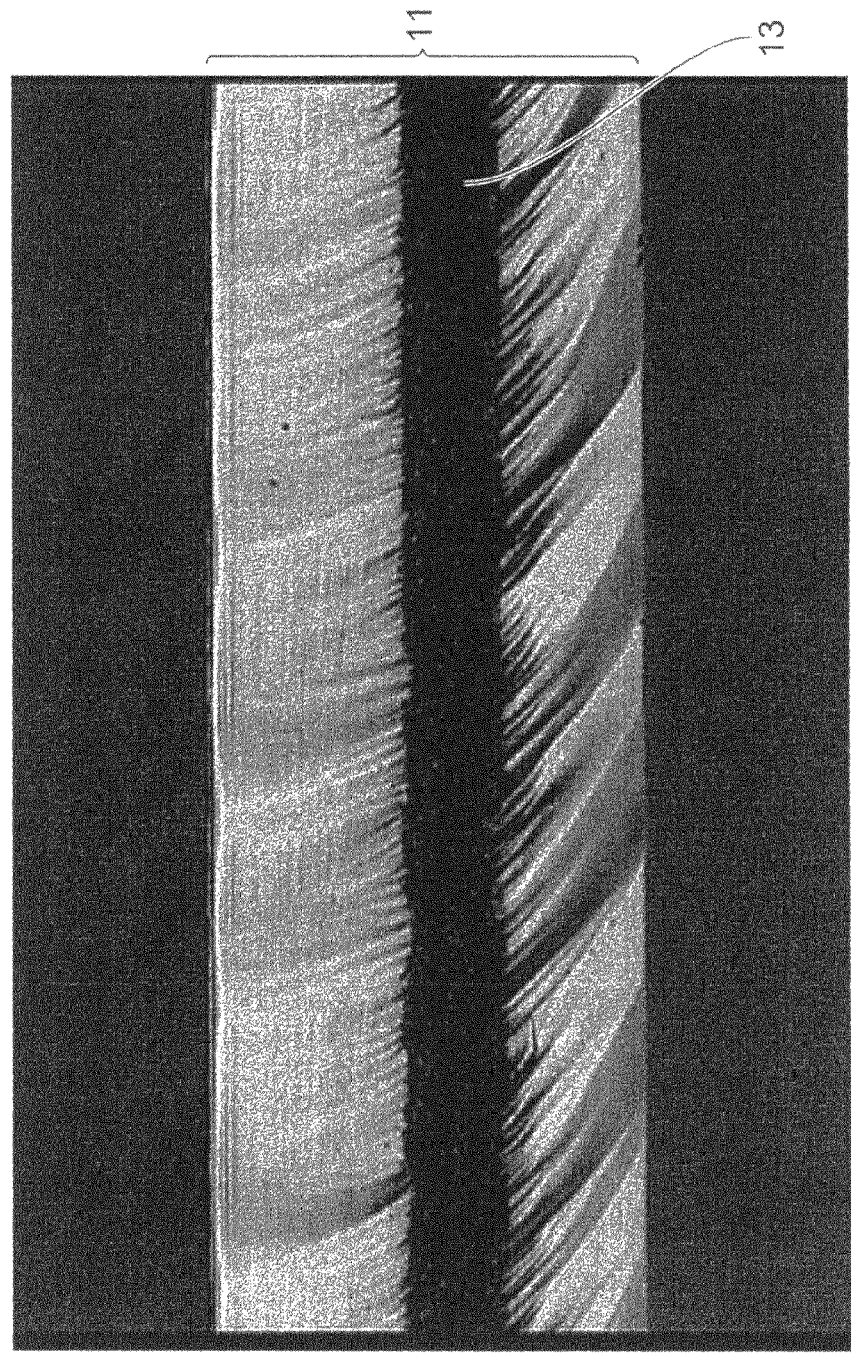
FIG. 12 A view showing a photograph of a cut section in a part of a silicon wafer cut by the laser processing method in accordance with the embodiment.

(A) Object to be processed: silicon wafer (with a thickness of 350 µm and an outer diameter of 4 inches)
(B) Laser
light source: semiconductor laser pumping Nd:YAG laser
wavelength: 1064 nm
laser light spot cross-sectional area: $3.14\times10^{-8}$ cm$^2$
oscillation mode: Q-switched pulse
repetition frequency: 100 kHz
pulse width: 30 ns
output: 20 µJ/pulse
laser light quality: TEM$_{00}$
polarizing property: linear polarization
(C) Condenser lens
magnification: ×50
N.A.: 0.55
transmittance at a laser light wavelength: 60%
(D) Moving rate of the mount table mounting the object: 100 mm/sec FIG. 12 is a view showing a photograph of a cross section of a part of a silicon wafer cut by laser processing under the conditions mentioned above. A molten processed region 13 is formed within the silicon wafer 11. The molten processed region 13 formed under the above-mentioned conditions has a size of about 100 µm in the thickness direction.

Figure 13:
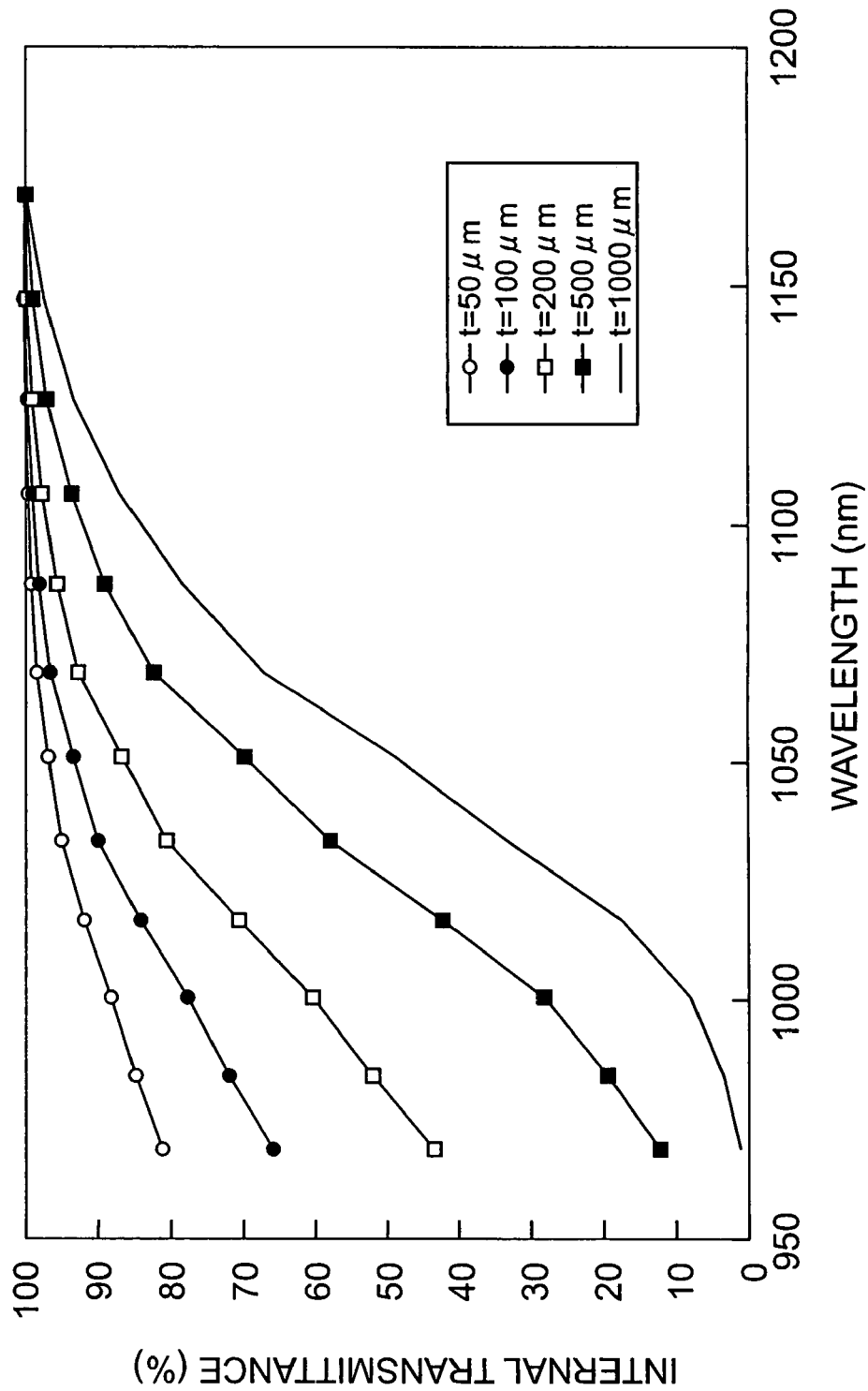
FIG. 13 A graph showing relationships between the laser light wavelength and the transmittance within a silicon substrate in the laser processing method in accordance with the embodiment.

The fact that the molten processed region 13 is formed by multiphoton absorption will now be explained. FIG. 13 is a graph showing relationships between the laser light wavelength and the transmittance within the silicon substrate. Here, the respective reflected components on the front and rear sides of the silicon substrate are eliminated, so as to show the internal transmittance alone. The respective relationships are shown in the cases where the thickness t of the silicon substrate is 50 µm, 100 µm, 200 µm, 500 µm, and 1000 µm.

For example, at the Nd:YAG laser wavelength of 1064 nm, the laser light appears to be transmitted through the silicon substrate by at least 80% when the silicon substrate has a thickness of 500 µm or less. Since the silicon wafer 11 shown in FIG. 12 has a thickness of 350 µm, the molten processed region 13 caused by multiphoton absorption is formed near the center of the silicon wafer 11, i.e., at a part distanced from the front face by 175 µm. The transmittance in this case is 90% or more with reference to a silicon wafer having a thickness of 200 µm, whereby the laser light is absorbed only slightly within the silicon wafer 11 but is substantially transmitted therethrough. This means that the molten processed region 13 is formed within the silicon wafer 11 not by laser light absorption within the silicon wafer 11 (i.e., not by usual heating with the laser light) but by multiphoton absorption. The forming of a molten processed region by multiphoton absorption is disclosed, for example, in "Silicon Processing Characteristic Evaluation by Picosecond Pulse Laser", Preprints of the National Meetings of Japan Welding Society, Vol. 66 (April, 2000), pp. 72-73.

A fracture is generated in a silicon wafer from a starting point region for cutting formed by a molten processed region, acting as a start point, in a cross-sectional direction, and reaches the front and rear faces of the silicon wafer, whereby the silicon wafer is cut. The fracture reaching the front and rear faces of the silicon wafer may grow naturally or as a force is applied to the silicon wafer. The fracture naturally growing from the starting point region for cutting to the front and rear faces of the silicon wafer encompasses a case where the fracture grows from a state where the molten processed region forming the starting point region for cutting is molten and a case where the fracture grows when the molten processed region forming the starting point region for cutting is re-solidified from the molten state. In either case, the molten processed region is formed only within the silicon wafer, and thus is present only within the cut section after cutting as shown in FIG. 12. When a starting point region for cutting is thus formed within the object by a molten processed region, unnecessary fractures deviating from a starting point region for cutting line are harder to occur at the time of cleaving, whereby cleavage control becomes easier.

(3) Case Where the Modified Region is Formed by a Molten Processed Region and a Microcavity An object to be processed (e.g., semiconductor material such as silicon) is irradiated with laser light while locating a converging point within the object under a condition with a field intensity of at least $1\times10^8$ (W/cm$^2$) at the converging point and a pulse width of 1 μs or less. This may form a molten processed region and a microcavity within the object. The upper limit of field intensity is $1\times10^{12}$ (W/cm$^2$), for example. The pulse width is preferably 1 ns to 200 ns, for example.

Figure 14:
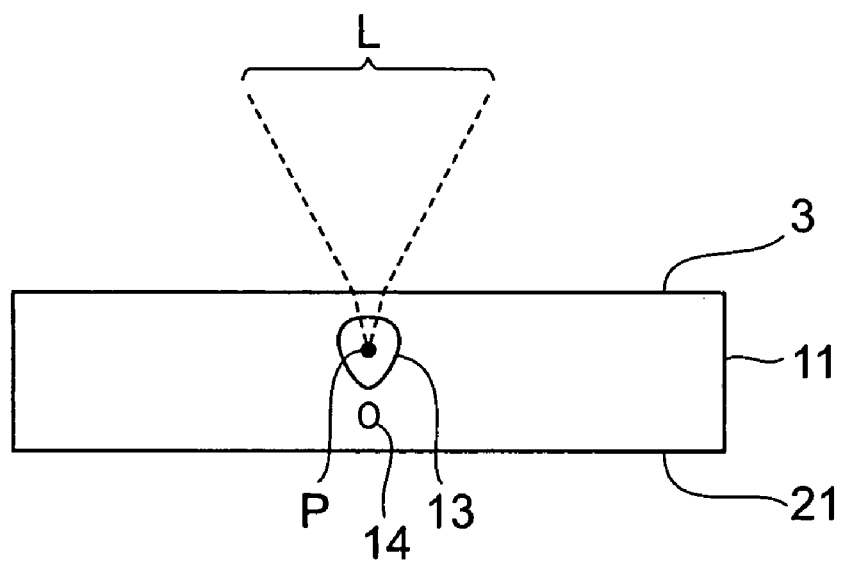
FIG. 14 A sectional view of a silicon wafer formed with a molten processed region and a microcavity by the laser processing method in accordance with the embodiment.

When laser light L is incident on a silicon wafer 11 from its front face 3 side as shown in FIG. 14, a microcavity 14 is formed on the rear face 21 side of the molten processed region 13. The molten processed region 13 and the microcavity 14 are separated from each other in FIG. 14, but may be formed continuously as well. Namely, when the molten processed region 13 and the microcavity 14 are formed as a pair by multiphoton absorption, the microcavity 14 is formed on the opposite side of the molten processed region 13 from the laser light entrance surface in the silicon wafer 11.

It is not completely clear by what principle the microcavity 14 is thus formed so as to correspond to each molten processed region 13 formed by generating multiphoton absorption within the silicon wafer 11 by transmitting the laser light L therethrough. Two hypotheses assumed by the inventors concerning the principle by which the molten processed region 13 and the microcavity 14 are formed as a pair will now be explained.

Figure 15:
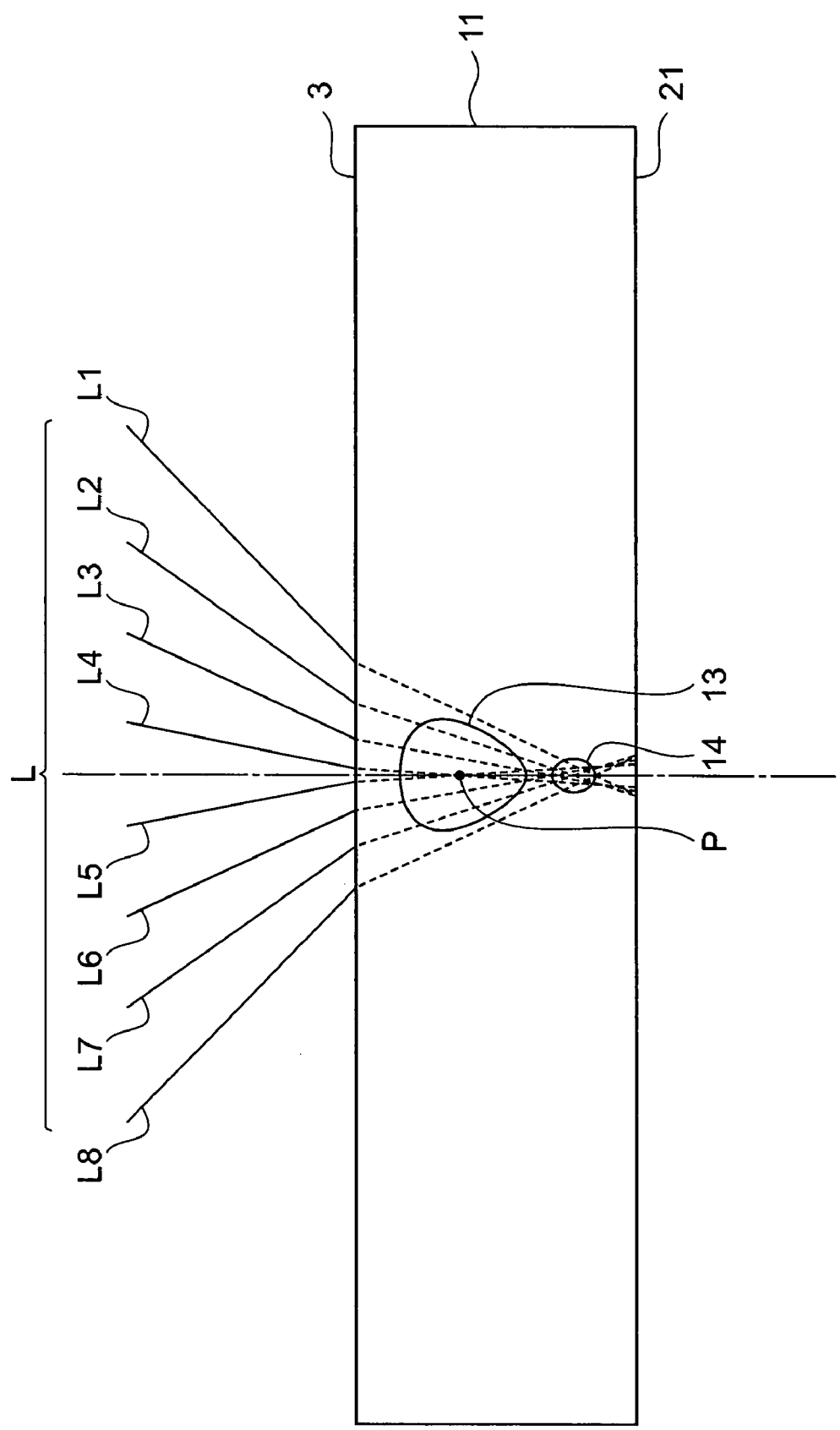
FIG. 15 A sectional view of a silicon wafer for explaining a principle by which the molten processed region and microcavity are formed by the laser processing method in accordance with the embodiment.

The first hypothesis assumed by the inventors is as follows. Namely, when the silicon wafer 11 is irradiated with the laser light L focused at a converging point P within the silicon wafer 11 as shown in FIG. 15, the molten processed region 13 is formed near the converging point P. Conventionally, light components in the center part of the laser light L emitted from a laser light source (light components corresponding to L4 and L5 in FIG. 15) have been used as the laser light L. This aims at using the center part of a Gaussian distribution of the laser light L.

The inventors have tried to expand the laser light L in order to restrain the laser light L from affecting the front face 3 of the silicon wafer 11. In one technique therefor, the laser light L emitted from the laser light source is expanded by a predetermined optical system, so as to widen the skirt of the Gaussian distribution, thereby relatively raising the laser intensity of light components in a peripheral part of the laser light L (those corresponding to L1 to L3 and L6 to L8 in FIG. 15). When thus expanded laser light L is transmitted through the silicon wafer 11, the molten processed region 13 is formed near the converging point P, and the microcavity 14 is formed at a part corresponding to the molten processed region 13 as explained above. Namely, the molten processed region 13 and the microcavity 14 are formed at respective positions on the optical axis (dash-dot line in FIG. 15) of the laser light L. The position at which the microcavity 14 is formed corresponds to a part where light components in the peripheral part of the laser light L (those corresponding to L1 to L3 and L6 to L8 in FIG. 15) are theoretically converged.

The spherical aberration of a lens converging the laser light L seems to cause light components in the center part of the laser light L (those corresponding to L4 and L5 in FIG. 15) and light components in the peripheral part of the laser light L (those corresponding to L1 to L3 and L6 to L8 in FIG. 15) to converge at respective parts different from each other in the thickness direction of the silicon wafer 11 as in the foregoing.

The first hypothesis assumed by the inventors lies in that the difference in converging positions may have some effects.

The second hypothesis assumed by the inventors lies in that, since the part where light components in the peripheral part of the laser light L (those corresponding to L1 to L3 and L6 to L8 in FIG. 15) are converged is a theoretical laser-converging point, the light intensity is so high in this part that minute structural changes occur, thereby forming the microcavity 14 whose surroundings do not substantially change their crystal structure, whereas the part formed with the molten processed region 13 is thermally affected so much that it is simply molten and re-solidified.

Here, the molten processed region 13 is as stated in (2) mentioned above, whereas the microcavity 14 is one whose periphery does not substantially change its crystal structure. When the silicon wafer 11 has a silicon monocrystal structure, the periphery of the microcavity 14 mostly keeps the silicon monocrystal structure.

By an experiment, the inventors verified that the molten processed region 13 and microcavity 14 were formed within the silicon wafer 11. The following are conditions of the experiment.

(A) Object to be processed: silicon wafer (with a thickness of 100 μm)
(B) Laser
  light source: semiconductor laser pumping Nd:YAG laser
  wavelength: 1064 nm
  repetition frequency: 40 kHz
  pulse width: 30 ns
  pulse pitch: 7 μm
  processing depth: 8 μm
  pulse energy: 50 μJ/pulse
(C) Condenser lens
  N.A.: 0.55
(D) Moving rate of the mount table mounting the object: 280 mm/sec FIG. 16 is a view showing photographs of a cut section of the silicon wafer 11 cut by laser processing under the above-mentioned conditions. In FIG. 16, (a) and (b) are photographs showing the same cut section on different scales. As depicted, within the silicon wafer 11, pairs of molten processed regions 13 and microcavities 14, each pair being formed by irradiation with one pulse of laser light L, are positioned at a predetermined pitch along the cross section (i.e., along a line to cut).

Each molten processed region 13 in the cut section shown in FIG. 16 has a width of about 13 μm in the thickness direction of the silicon wafer 11 (the vertical direction in the drawing) and a width of about 3 μm in the moving direction of laser light L (the horizontal direction in the drawing). Each microcavity 14 has a width of about 7 μm in the thickness direction of the silicon wafer 11 and a width of about 1.3 μm in the moving direction of laser light L. The gap between the molten processed region 13 and microcavity 14 is about 1.2 μm.

(4) Case Where the Modified Region is a Refractive Index Changed Region

An object to be processed (e.g., glass) is irradiated with laser light while locating a converging point within the object under a condition with a field intensity of at least $1\times10^8$ (W/cm$^2$) at the converging point and a pulse width of 1 ns or less. When multiphoton absorption is generated within the object with a very short pulse width, the energy caused by multiphoton absorption is not converted into thermal energy, whereby an eternal structure change such as ion valence change, crystallization, or orientation polarization is induced within the object, thus forming a refractive index change region. The upper limit of field intensity is $1\times10^{12}$ (W/cm$^2$), for example. The pulse width is preferably 1 ns or less, for example, more preferably 1 ps or less. The forming of a refractive index change region by multiphoton absorption is disclosed, for example, in "Forming of Photoinduced Structure within Glass by Femtosecond Laser Irradiation", Proceedings of the 42nd Laser Materials Processing Conference (November, 1997), pp. 105-111.

The cases (1) to (4) are explained in the foregoing as a modified region formed by multiphoton absorption. A starting point region for cutting may be formed as follows while taking account of the crystal structure of a wafer-like object to be processed and its cleavage characteristic, whereby the object can be cut with a favorable precision by a smaller force from the starting point region for cutting acting as a start point.

Namely, in the case of a substrate made of a monocrystal semiconductor having a diamond structure such as silicon, it will be preferred if a starting point region for cutting is formed in a direction extending along a (111) plane (first cleavage plane) or a (110) plane (second cleavage plane). In the case of a substrate made of a group III-V compound semiconductor of sphalerite structure such as GaAs, it will be preferred if a starting point region for cutting is formed in a direction extending along a (110) plane. In the case of a substrate having a crystal structure of hexagonal system such as sapphire (Al$_2$O$_3$), it will be preferred if a starting point region for cutting is formed in a direction extending along a (1120) plane (A plane) or a (1100) plane (M plane) while using a (0001) plane (C plane) as a principal plane.

When the substrate is formed with an orientation flat in a direction to be formed with the above-mentioned starting point region for cutting (e.g., a direction extending along a (111) plane in a monocrystal silicon substrate) or a direction orthogonal to the direction to be formed therewith, the starting point region for cutting extending in the direction to be formed with the starting point region for cutting can be formed easily and accurately with reference to the orientation flat.

Figure 17:
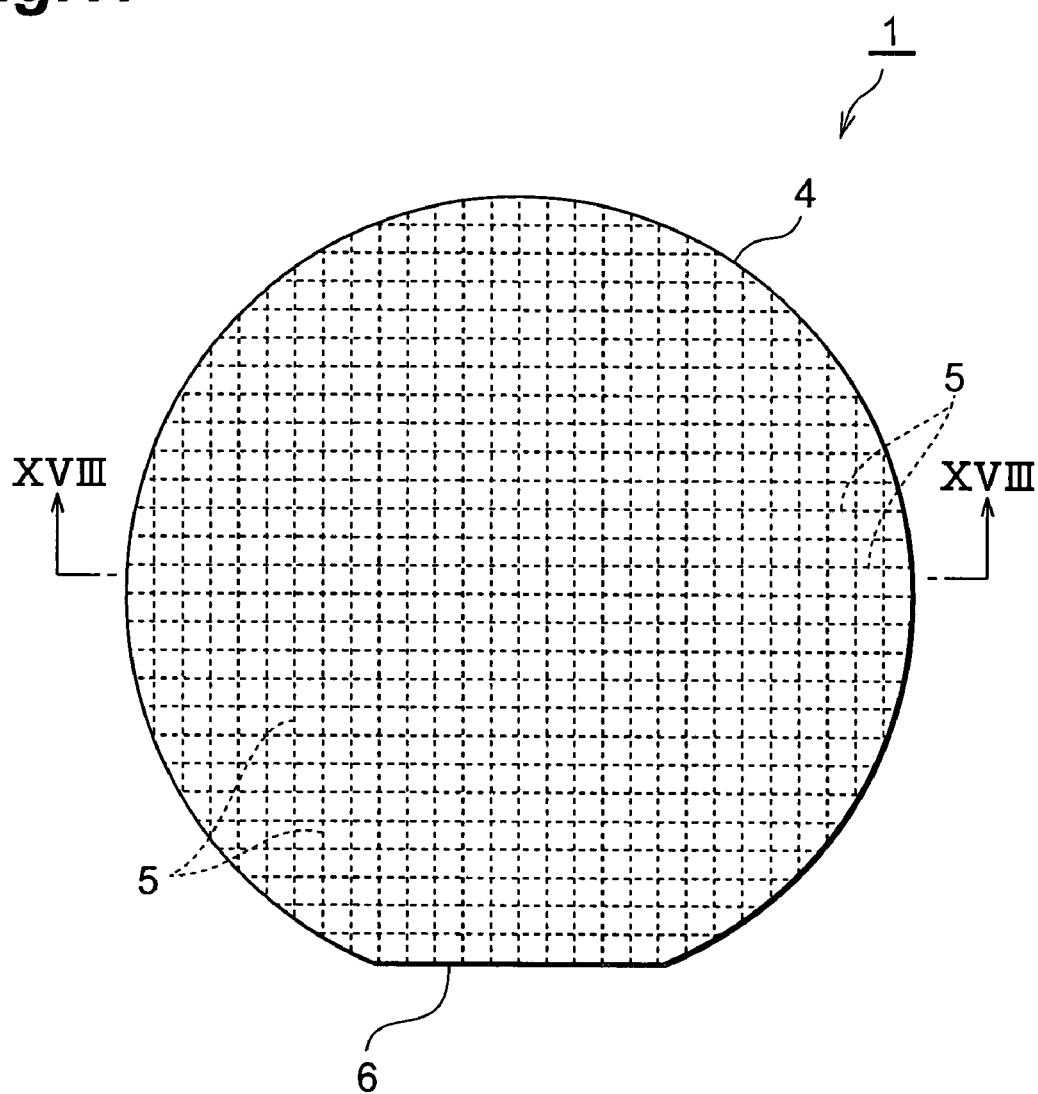
FIG. 17 A plan view of the object to be processed in the laser processing method in accordance with the embodiment.
Figure 18:
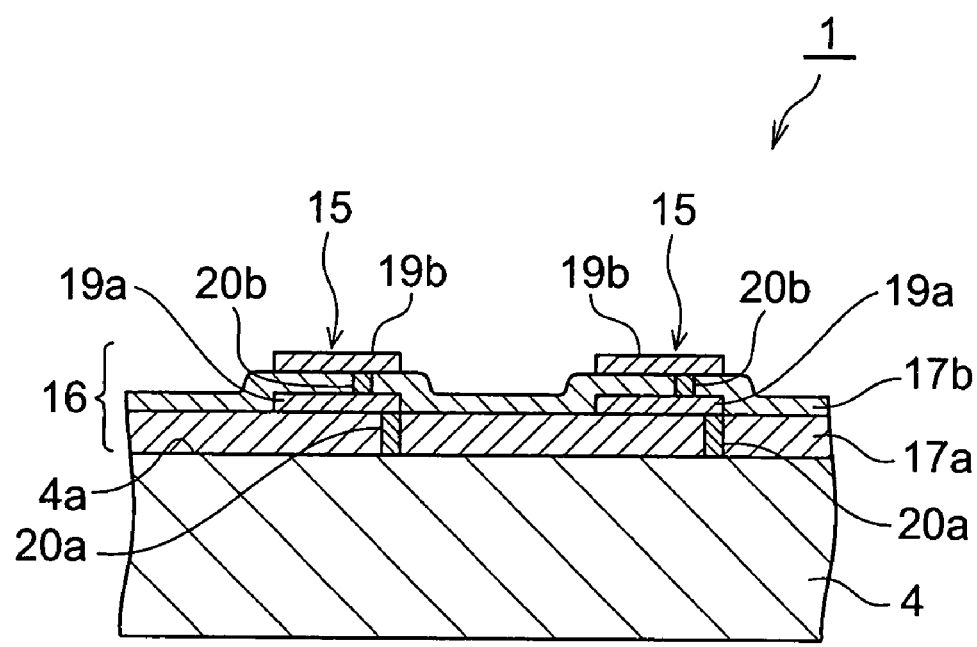
FIG. 18 A sectional view of a part of the object taken along the line XVIII-XVIII of FIG. 17.

The preferred embodiment of the present invention will now be explained. FIG. 17 is a plan view of the object to be processed in the laser processing method in accordance with this embodiment, whereas FIG. 18 is a sectional view of a part of the object taken along the line XVIII-XVIII of FIG. 17. Referring to FIG. 17, the object to be processed 1, which is a wafer, has a flat, substantially disk-like form. A plurality of lines to cut 5 (grid-like lines to cut) intersecting each other in longitudinal and lateral directions are set on the front face of the object 1. The lines to cut 5 are virtual lines assumed for cutting the object 1 into a plurality of chip-like parts.

As shown in FIGS. 17 and 18, the object 1 comprises a substrate 4 having a thickness of 30 μm to 150 μm made of silicon, and a multilayer part 16, formed on the front face 4a of the substrate 4, including a plurality of functional devices 15. Each functional device 15 has an interlayer insulating film 17a laminated on the front face 4a of the substrate 4, a wiring layer 19a formed on the interlayer insulating film 17a, an interlayer insulating film 17b laminated on the interlayer insulating film 17a so as to cover the wiring layer 19a, and a wiring layer 19b formed on the interlayer insulating film 17b. The wiring layer 19a and the substrate 4 are electrically connected to each other by a conductive plug 20a penetrating through the interlayer insulating film 17a, whereas the wiring layers 19a and 19b are electrically connected to each other by a conductive plug 20b penetrating through the interlayer insulating film 17b.

While a number of functional devices 15 are formed like a matrix in directions parallel and perpendicular to an orientation flat 6 of the substrate 4, the interlayer insulating films 17a, 17b are formed between the functional devices 15, 15 adjacent to each other so as to cover the front face 4a of the substrate 4 as a whole.

Thus configured object 1 is cut into the functional devices 15 as follows. First, as shown in FIG. 19(a), a protective tape (protective member) 22 is attached to the front face 16a of the multilayer part 16 so as to cover the functional devices 15. Subsequently, as shown in FIG. 19(b), the object 1 is fixed onto a mount table (not depicted) of a laser processing apparatus such that the rear face 4b of the substrate 4 faces up. Here, the protective tape 22 prevents the multilayer part 16 from coming into direct contact with the mount table, whereby each functional device 15 can be protected.

Then, lines to cut 5 are set like grids (see broken lines in FIG. 17) so as to pass between the functional devices 15, 15 adjacent to each other, and the substrate 4 is irradiated with laser light L under a condition generating multiphoton absorption, while using the rear face 4b of the substrate 4 as a laser light entrance surface, locating a converging point P within the substrate 4, and moving the mount table so as to scan the light-converging point P along the lines to cut 5. This forms a modified region 7 to become a starting point region for cutting within the substrate 4 such that the distance between the position of its front-side end part 7a and the front face 4a of the substrate 4 (referring to the distance in the thickness direction of the substrate 4 unless otherwise stated) is 3 μm to 40 μm. Forming the modified region 7 under such a condition will generate a fracture 24 reaching the front face 4a of the substrate 4 from the front-side end part 7a of the modified region 7.

Since the rear face 4b of the substrate 4 is used as the laser light entrance surface when irradiating the object 1 with the laser light L, the modified region 7 can be formed reliably within the substrate 4 along the lines to cut 5 even when a member (e.g., TEG) reflecting the laser light L exists on the lines to cut 5 of the multilayer part 16. Since the substrate 4 is a semiconductor substrate made of silicon, the modified region 7 is a molten processed region 13. Here, the modified region 7 is formed by one row per line to cut 5.

After generating the fracture 24 by forming the modified region 7, an expandable tape (expandable member) 23 is attached to the rear face 4b of the substrate 4 as shown in FIG. 20(a). Subsequently, the protective tape 22 is irradiated with UV rays as shown in FIG. 20(b), so as to lower its adhesive force, and then is peeled off from the front face 16a of the multilayer part 16 as shown in FIG. 21(a).

After peeling off the protective tape 22, the expandable tape 23 is expanded as shown in FIG. 21(b), so as to cause a break from the modified region 7 acting as a start point, thereby cutting the substrate 4 and multilayer part 16 along the lines to cut 5 (the location of one of which is depicted in FIG. 21(b)) and separating semiconductor chips 25 obtained by cutting from each other. This can yield the semiconductor chips 25 each comprising the substrate 4 and the multilayer part 16, formed on the front face 4a of the substrate 4, including the functional device 15, whereas the modified region 7 is formed on a side face 4c of the substrate 4 such that the distance between the position of the front-side end part 7a and the front face 4a of the substrate 4 is 3 μm to 40 μm.

As explained in the foregoing, the above-mentioned laser processing method irradiates the substrate 4 with the laser light L while using the rear face 4b thereof as a laser light entrance surface in a state where the protective tape 22 is attached to the front face 16a of the multilayer part 16, so as to form the modified region 7 within the substrate 4 along the lines to cut 5, thereby generating the fracture 24 reaching the front face 4a of the substrate 4 from the front-side end part 7a of the modified region 7. When the expandable tape 23 is attached to the rear face 4b of the substrate 4 and expanded in the state where such a fracture 24 is generated, not only the substrate 4 but also the multilayer part 16, i.e., the interlayer insulating films 17a, 17b, can be cut with a favorable precision along the lines to cut 5. Namely, in the semiconductor chip 25 obtained by cutting, the end part 16c of the multilayer part 16 corresponding to the side face 4c of the substrate 4 formed with the modified region 7 is cut with a high precision as shown in FIG. 21(b).

The substrate 4 has a thickness of 30 μm to 150 μm in the above-mentioned object 1. When the substrate 4 has a thickness of 30 μm to 150 μm as such, not only the multilayer part 16 but also the substrate 4 can be cut with a higher precision from one row of modified region 7 acting as a start point.

Figure 22:
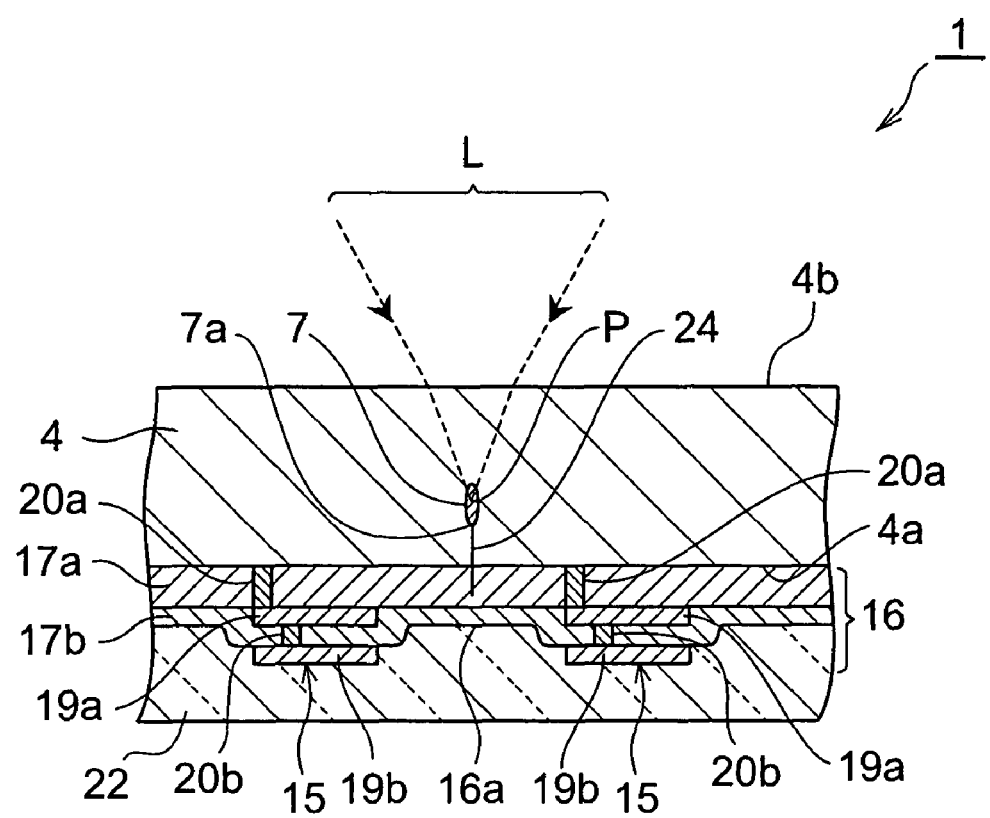
FIG. 22 A sectional view of a part of the object in which a crack reaching the inside of a multilayer part from the front-side end part of a modified region is generated.
Figure 23:
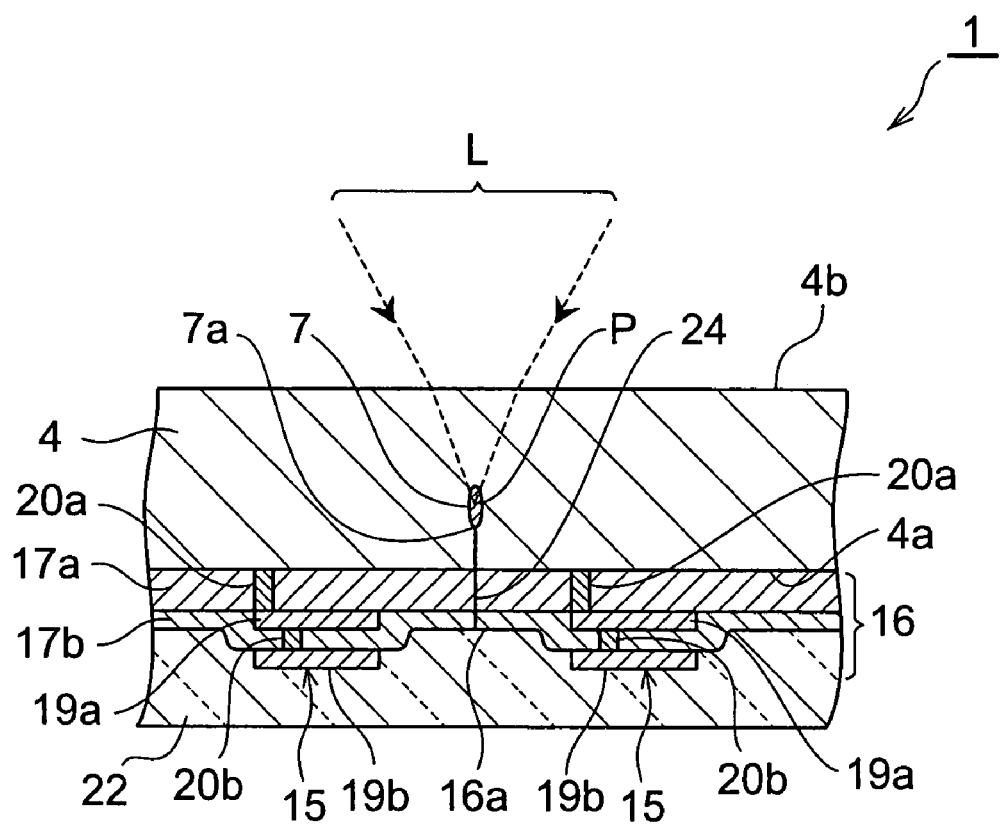
FIG. 23 A sectional view of a part of the object in which a crack reaching the front face of the multilayer part from the front-side end part of the modified region is generated.

Though the above-mentioned laser processing method generates the fracture 24 reaching the front face 4a of the substrate 4 from the front-side end part 7a of the modified region 7 by forming the modified region 7 along the lines to cut 5, a fracture 24 reaching the inside of the multilayer part 16 from the front-side end part 7a of the modified region 7 may be generated as shown in FIG. 22, and a fracture 24 reaching the front face 16a of the multilayer part 16 from the front-side end part 7a of the modified region 7 may be generated as shown in FIG. 23. Namely, when cutting the object 1 comprising the substrate 4 and the multilayer part 16, formed on the front face 4a of the substrate 4, including the functional device 15, the multilayer part 16 can be cut with a high precision in particular if the fracture 24 reaching at least the front face 4a of the substrate 4 from the front-side end part 7a of the modified region 7 is generated by forming the modified region 7 within the substrate 4 along the lines to cut 5.

Though the above-mentioned laser processing method forms the modified region 7 within the substrate 4 such that the distance between the position of the front-side end part 7a and the front face 4a of the substrate 4 is 3 μm to 40 μm, the modified region 7 may be formed such that the center of the modified region 7 is positioned closer to the front face 4a of the substrate 4 than is the center of the substrate 4. Thus forming the modified region 7 can make it easier to generate the fracture 24 reaching at least the front face 4a of the substrate 4 from the front-side end part 7a of the modified region 7.

Reasons why the multilayer part 16 can be cut with a high precision when the fracture 24 reaching at least the front face 4a of the substrate 4 from the front-side end part 7a of the modified region 7 is generated will now be explained. Here, it is assumed that a low dielectric constant film (low-k film) is laminated as the multilayer part 16 on the front face 4a of the substrate 4 made of silicon.

(1) Case Where the Fracture 24 Reaching the Front Face 4a of the Substrate 4 from the Front-Side End Part 7a of the Modified Region 7 is Generated FIG. 24 is a sectional view of a part of the object 1 for explaining the first reason why the low dielectric constant film 26 can be cut with a high precision when the fracture 24 reaching the front face 4a of the substrate 4 from the front-side end part 7a of the modified region 7 is generated.

When the expandable tape 23 is expanded in the state where the fracture 24 reaching the rear face 4b of the substrate 4 from the rear-side end part 7b of the modified region 7 is generated as shown in FIG. 24(a), the fracture 24 extends toward the front face 4a of the substrate 4 very smoothly. Therefore, the state where the fracture 24 reaching the rear face 4b of the substrate 4 from the rear-side end part 7b of the modified region 7 is generated can be construed as a state where the substrate 4 is easy to cut.

On the other hand, the state where the fracture 24 reaching the front face 4a of the substrate 4 from the front-side end part 7a of the modified region 7 as shown in FIG. 24(b) can be construed as a state where the substrate 4 is harder to cut than in the state where the fracture 24 reaching the rear face 4b of the substrate 4 from the rear-side end part 7b of the modified region 7 is generated.

When the expandable tape 23 is expanded in the state where the fracture 24 reaching the front face 4a of the substrate 4 from the front-side end part 7a of the modified region 7, i.e., in the state where the substrate 4 is hard to cut, the substrate 4 is not cut gradually as the expandable tape 23 expands, but at once. This seems to prevent the low dielectric constant film 26, which has a low mechanical strength and a property of being harder to blend with other materials in general so as to be prone to tear and peel off, from tearing and peeling off, and make it possible to cut the low dielectric constant film 26 with a high precision together with the substrate 4.

FIG. 25 is a sectional view of a part of the object 1 for explaining the second reason why the low dielectric constant film 26 can be cut with a high precision when the fracture 24 reaching the front face 4a of the substrate 4 from the front-side end part 7a of the modified region 7 is generated.

When the expandable tape 23 is expanded in the state where the fracture 24 reaching the rear face 4b of the substrate 4 from the rear-side end part 7b of the modified region 7 is generated as shown in FIG. 25(a), the substrate 4 is gradually cut as the expandable tape 23 is expanded. Therefore, at the time when the fracture 24 reaches the low dielectric constant film 26, the low dielectric constant film 26 warps in the valley-folding direction and tears in this state.

If the expandable tape 23 is expanded in the state where the fracture 24 reaching the front face 4a of the substrate 4 from the front-side end part 7a of the modified region 7 is generated as shown in FIG. 25(b), on the other hand, the substrate 4 will be cut at once at the time when a predetermined expansive force acts on the substrate 4. This prevents the low dielectric constant film 26 from tearing in the state warped in the valley-folding direction.

Therefore, the state where the fracture 24 reaching the front face 4a of the substrate 4 from the rear-side end part 7a of the modified region 7 is generated seems to be able to cut the low dielectric constant film 26 with a higher precision together with the substrate 4 than the state where the fracture 24 reaching the rear face 4b of the substrate 4 from the rear-side end part 7b of the modified region 7 is generated.

Figure 26:
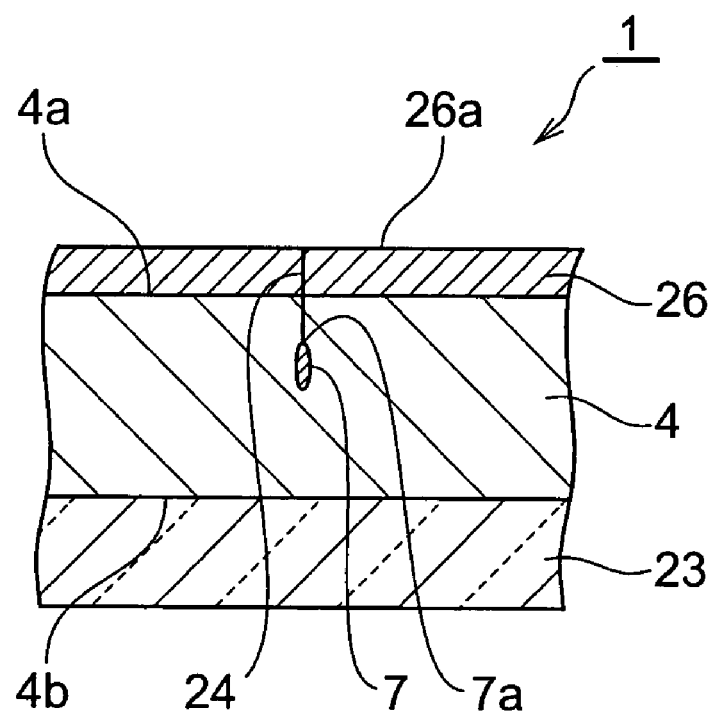
FIG. 26 A sectional view of a part of the object for explaining a reason why a low dielectric constant film can be cut with a high precision when a fracture reaching the front face of the low dielectric constant film from the front-side end part of the modified region is generated.

(2) Case Where the Fracture 24 Reaching the Front Face 26a of the Low Dielectric Constant Film 26 from the Front-Side End Part 7a of the Modified Region 7 is Generated FIG. 26 is a sectional view of a part of the object 1 for explaining a reason why the low dielectric constant film 26 can be cut with a high precision when the fracture 24 reaching the front face 26a of the low dielectric constant film 26 from the front-side end part 7a of the modified region 7 is generated. As shown in this drawing, the low dielectric constant film 26 is cut at the time when the modified region 7 is formed within the substrate 4 along the lines to cut 5 in this case. Therefore, this seems to be able to cut the low dielectric constant film 26 while preventing it from tearing and peeling off.

Figure 27:
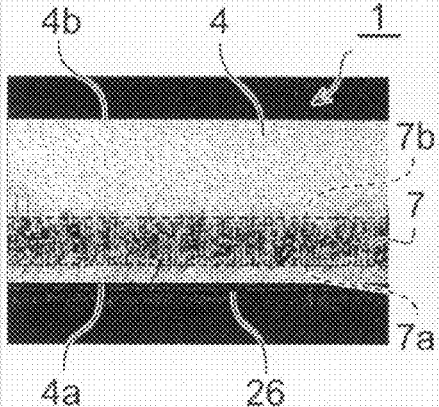
FIG. 27 A view showing photographs representing results of cutting of the object in the case where the fracture has reached the front face of the substrate and the case where the fracture has reached the front face of the low dielectric constant film.
Figure 28:
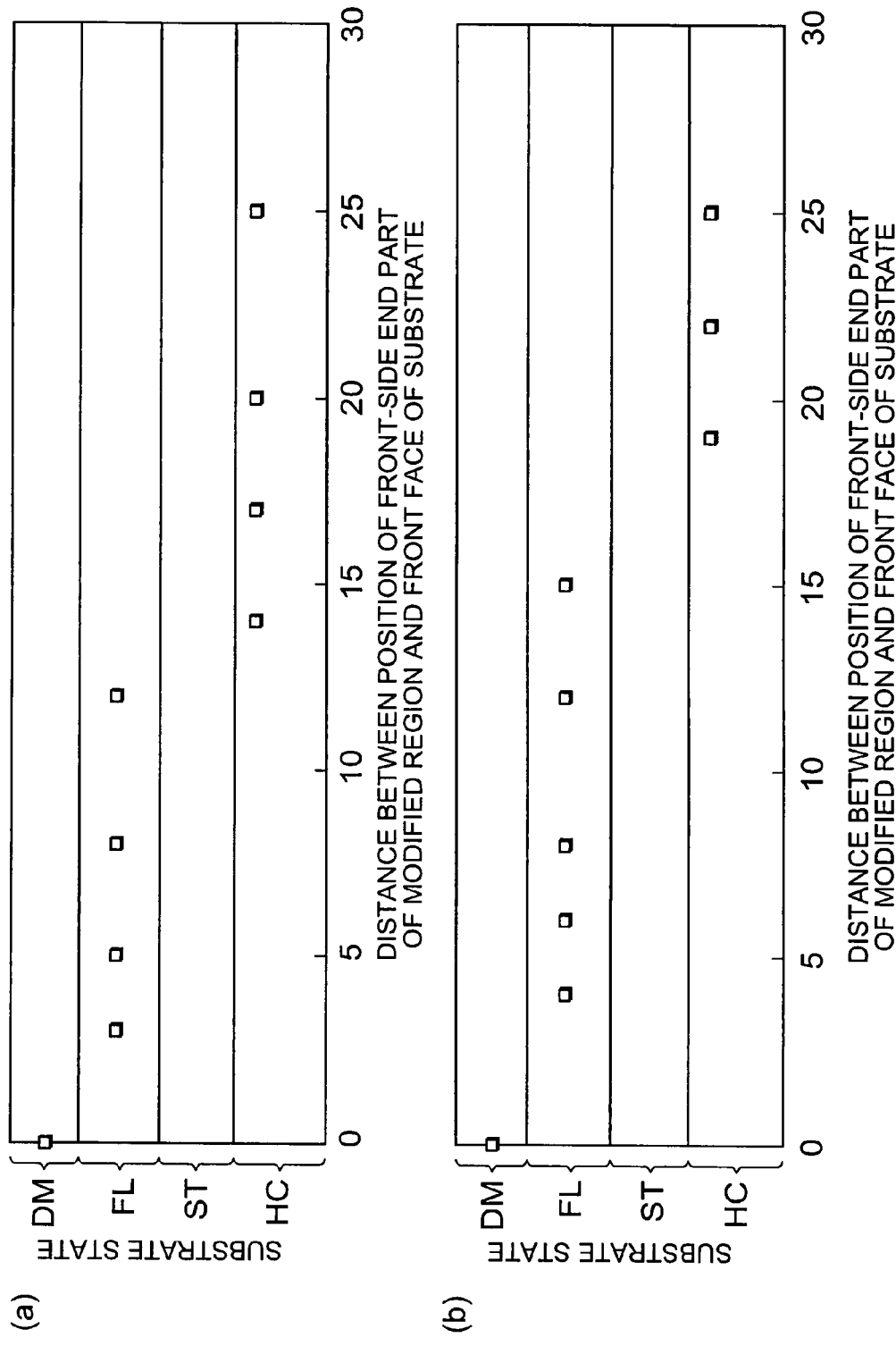
FIG. 28 A chart showing "the relationship between the distance from the position of the front-side end part of the modified region to the front face of the substrate and the state of the substrate" concerning a substrate having a thickness of 30 μm.
Figure 29:
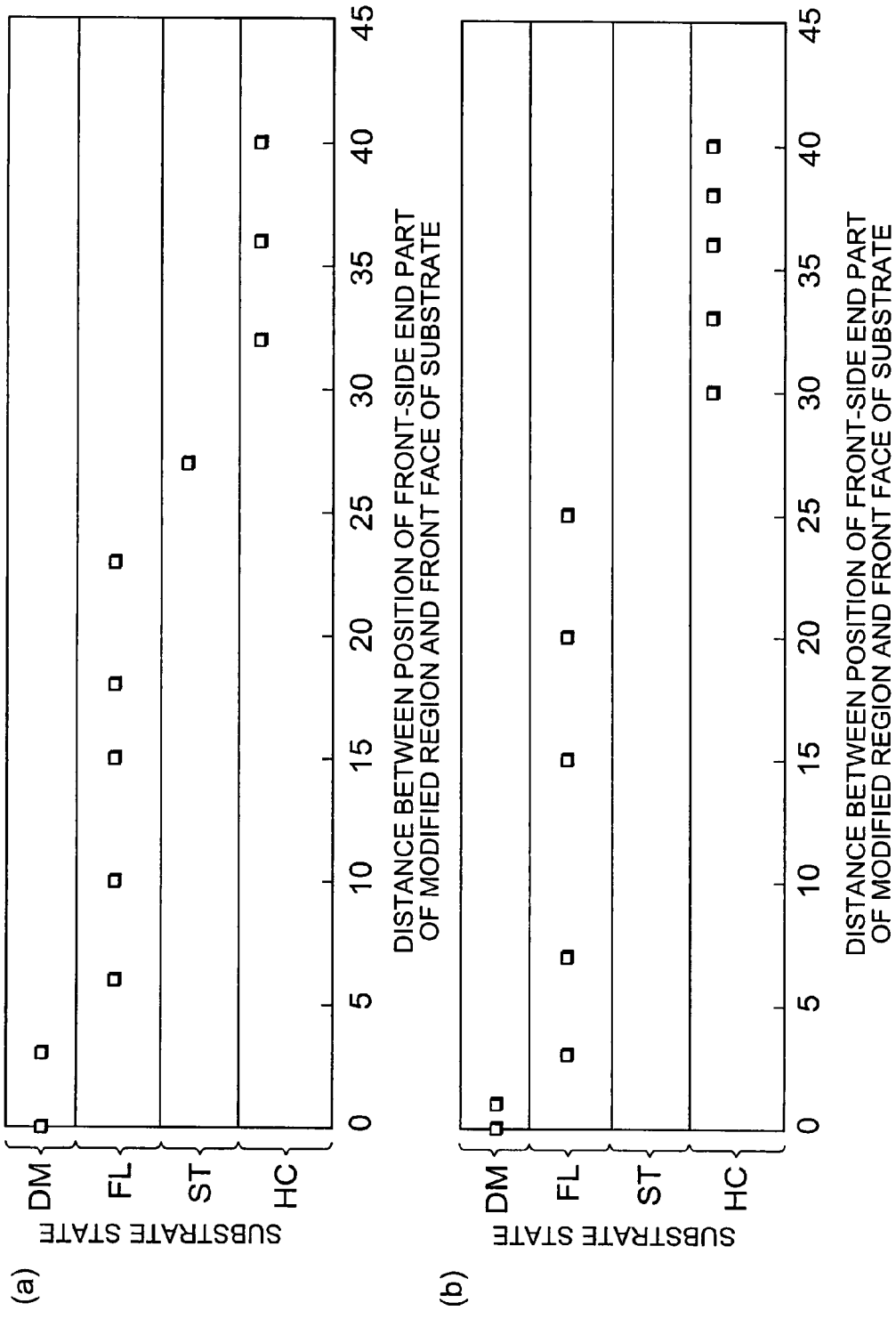
FIG. 29 A chart showing "the relationship between the distance from the position of the front-side end part of the modified region to the front face of the substrate and the state of the substrate" concerning a substrate having a thickness of 50 μm.
Figure 30:
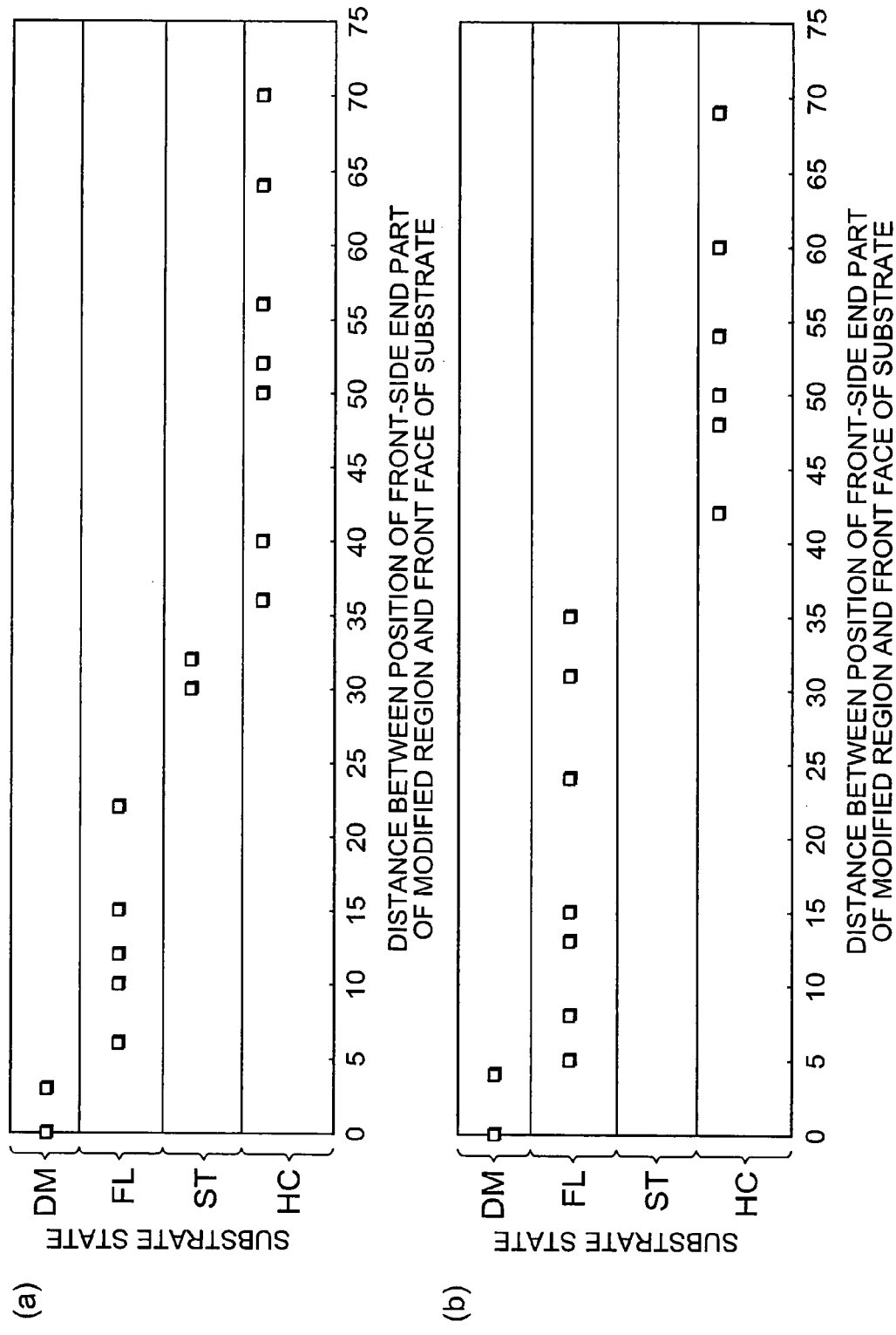
FIG. 30 A chart showing "the relationship between the distance from the position of the front-side end part of the modified region to the front face of the substrate and the state of the substrate" concerning a substrate having a thickness of 100 μm.
Figure 31:
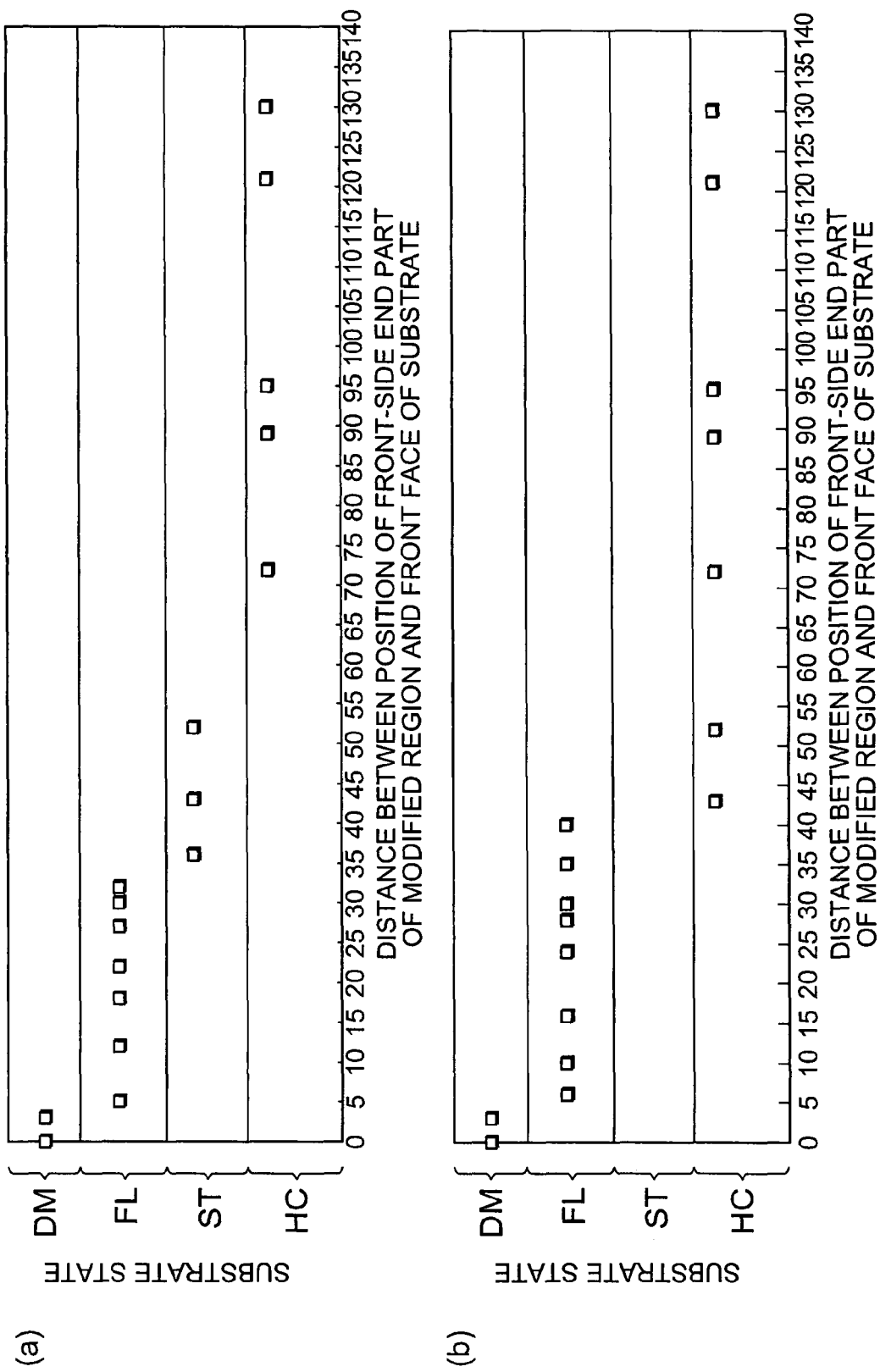
FIG. 31 A chart showing "the relationship between the distance from the position of the front-side end part of the modified region to the front face of the substrate and the state of the substrate" concerning a substrate having a thickness of 150 μm.

The results of cutting in the cases of (1) and (2) mentioned above are as follows. As shown in FIG. 27, both of the cases where the fracture 24 reached the front face 4a of the substrate 4 and where the fracture 24 reached the front face 26a of the low dielectric constant film 26 were able to cut the low dielectric constant film 26 with a very high precision (see the photographs in the lower part). Also, they were able to suppress the tear of the low dielectric constant film 26 to less than 5 µm even in the part where Al pads 27 are formed on the lines to cut 5 (see the photographs in the middle part).

Here, the front-side end part distance of the modified region 7 refers to the distance between the position of the front-side end part of the modified region 7 and the front face 4a of the substrate 4, whereas the rear-side end part distance of the modified region 7 refers to the distance between the position of the rear-side end part 7b of the modified region 7 and the rear face 4b of the substrate 4. The width of the modified region 7 refers to the distance between the position of the front-side end part 7a and the position of the rear-side end part 7b in the modified region 7. The position of the front-side end part 7a of the modified region 7 refers to "the average position in the thickness direction of the substrate 4" of "the end part facing the front face 4a of the substrate 4" of the modified region 7 formed along the lines to cut 5, whereas the position of the rear-side end part 7b of the modified region 7 refers to "the average position in the thickness direction of the substrate 4" of "the end part facing the rear face 4b of the substrate 4" of the modified region 7 formed along the lines to cut 5 (see the photographs in the upper part of FIG. 27).

The relationship between the distance from the position of the front-side end part 7a of the modified region 7 to the front face 4a of the substrate 4 and the state of the substrate 4 will now be explained.

FIGS. 28 to 31 are charts showing "the relationships between the distance from the position of the front-side end part 7a of the modified region 7 to the front face 4a of the substrate 4 and the state of the substrate 4" for the substrates 4 having thicknesses of 30 µm, 50 µm, 100 µm, and 150 µm, respectively.

In each chart, (a) is a case where the converging point P of laser light L is scanned once along the lines to cut 5, whereas (b) is a case where the converging point P of laser light L is scanned twice along the lines to cut 5. State DM of the substrate 4 refers to a state where the front face 4a of the substrate 4 is dotted with damages, whereas state FL of the substrate 4 refers to a state where the fracture 24 has reached the front face 4a of the substrate 4. State ST of the substrate 4 refers to a case where no changes appear in any of the front face 4a and rear face 4b of the substrate 4, whereas state HC of the substrate 4 refers to a case where the fracture 24 has reached the rear face 4b of the substrate 4.

A bare wafer made of silicon was used as the substrate 4 when verifying "the relationship between the distance from the position of the front-side end part 7a of the modified region 7 to the front face 4a of the substrate 4 and the state of the substrate 4". The irradiation conditions for laser light L along the lines to cut 5 are as follows:

Repetition frequency: 80 kHz
Pulse width: 150 ns
Pulse energy: 15 µJ
Processing speed (moving speed of the converging point P with respect to the substrate 4): 300 mm/sec As is clear from FIGS. 28(a) to 31(a), the fracture 24 reaching at least the front face 4a of the substrate 4 from the front-side end part 7a of the modified region 7 can reliably be generated (state FL of the substrate 4) when the modified region 7 is formed such that the distance between the position of the front-side end part 7a of the modified region 7 and the front face 4a of the substrate 4 is 3 µm to 35 µm in the case where the laser light L is irradiated once along the lines to cut 5.

As is clear from FIGS. 28(b) to 31(b), the fracture 24 reaching at least the front face 4a of the substrate 4 from the front-side end part 7a of the modified region 7 can reliably be generated (state FL of the substrate 4) when the modified region 7 is formed such that the distance between the position of the front-side end part 7a of the modified region 7 and the front face 4a of the substrate 4 is 3 µm to 40 µm in the case where the laser light L is irradiated twice along the lines to cut 5.

The present invention is not limited to the above-mentioned embodiment.

For example, as shown in FIG. 32, the modified region 7 may be formed within the substrate 4 along the lines to cut 5 such that the front-side end part 7a of the modified region 7 extends like a streak to the front face 4a of the substrate 4 ((a) and (b) in FIG. 32 showing photographs of the same cut section on different scales). Thus forming the modified region 7 generates the fracture 24 reaching at least the front face 4a of the substrate 4 from the front-side end part 7a of the modified region 7. When the expandable tape 23 is attached to the rear face 4b of the substrate 4 and expanded in the state where such a fracture 24 is generated, not only the substrate 4 but also the multilayer part 16 (the low dielectric constant film 26 in FIG. 32) in particular can be cut with a favorable precision along the lines to cut 5. Here, the front-side end part 7a of the modified region 7 is likely to extend like a streak to the front face 4a of the substrate 4 when a member (e.g., metal wire or metal pad) reflecting the laser light L exists on the lines to cut 5 in the multilayer part 16.

Though the above-mentioned embodiment is a case where the molten processed region 13 is formed as the modified region 7 within a semiconductor substrate such as silicon wafer, a molten processed region 13 and a microcavity 14 positioned closer to the front face 4a of the substrate 4 than is the molten processed region 13 may be formed as the modified region 7. Thus forming the microcavity 14 positioned closer to the front face 4a of the substrate 4 than is the molten processed region 13 improves the rectilinearity of the fracture 24 reaching at least the front face 4a of the substrate 4, whereby the multilayer part 16 in particular can be cut with a higher precision along the lines to cut 5.

Though the above-mentioned embodiment is a case where the modified region 7 is formed by generating multiphoton absorption within the substrate 4, there is a case where the modified region 7 can be formed by generating light absorption equivalent to multiphoton absorption within the substrate 4.

Examples of the multilayer part formed on the lines to cut include organic and inorganic insulating films; their composite films; low dielectric constant films; conductive films such as TEG, metal wires, and electrodes; and those formed with at least one layer of them.

INDUSTRIAL APPLICABILITY

When cutting an object to be processed comprising a substrate and a multilayer part, formed on the front face of the substrate, including a functional device, the present invention can cut the multilayer part with a high precision in particular.

The invention claimed is:
1. A laser processing method of cutting an object to be processed along a cutting line, the object comprising a substrate and a multilayer part formed on a front face of the substrate, the multilayer part including a functional device positioned adjacent to and along the cutting line, the method comprising the steps of:

attaching a protective member to a front face of the multilayer part;

irradiating the substrate with laser light through a rear face of the substrate comprising a laser light entrance surface and locating a converging point of the laser light within the substrate in order to form a modified region within the substrate which serves as a starting point region for cutting the substrate along the cutting line, thereby generating a fracture reaching at least the front face of the substrate from an end part of the modified region located closest to the front face of the substrate, without generating any fracture reaching the rear face of the substrate from the modified region;

attaching an expandable member to the rear face of the substrate that no fracture has reached after generating the fracture; and cutting the object along the cutting line by expanding the expandable member after attaching the expandable member to the rear face of the substrate.

2. A laser processing method according to claim 1, wherein the method comprises generating a fracture reaching the inside of the multilayer part from the end part of the modified region.

3. A laser processing method according to claim 1, wherein the method comprises generating a fracture reaching the front face of the multilayer part from the end part of the modified region.

4. A laser processing method according to claim 1, wherein the modified region is formed such that a center of the modified region is positioned closer to the front face of the substrate than is a center of the substrate.

5. A laser processing method according to claim 1, wherein the substrate is a semiconductor substrate, and wherein the modified region includes a molten processed region.

6. A laser processing method according to claim 1, wherein the substrate is a semiconductor substrate, and wherein the modified region includes a molten processed region and a microcavity positioned closer to the front face of the substrate than is the molten processed region.

7. A laser processing method according to claim 1, wherein the multilayer part includes a low dielectric constant film.

* * * * *